(12) United States Patent
Kaneko et al.

(10) Patent No.: US 7,759,696 B2
(45) Date of Patent: Jul. 20, 2010

(54) HIGH-BREAKDOWN VOLTAGE SEMICONDUCTOR SWITCHING DEVICE AND SWITCHED MODE POWER SUPPLY APPARATUS USING THE SAME

(75) Inventors: Saichirou Kaneko, Kyoto (JP); Tetsuji Yamashita, Kyoto (JP); Toshihiko Uno, Osaka (JP)

(73) Assignee: Panasonic Corporation, Osaka (JP)

( * ) Notice: Subject to any disclaimer, the term of this patent is extended or adjusted under 35 U.S.C. 154(b) by 614 days.

(21) Appl. No.: 11/582,441

(22) Filed: Oct. 18, 2006

(65) Prior Publication Data

US 2007/0090482 A1    Apr. 26, 2007

(30) Foreign Application Priority Data

Oct. 20, 2005  (JP)  ............................. 2005-305335
Apr. 27, 2006  (JP)  ............................. 2006-124080

(51) Int. Cl.
*H01L 29/735* (2006.01)
*H01L 29/78* (2006.01)

(52) U.S. Cl. ...................... 257/141; 257/343; 257/401; 257/E29.027; 257/E29.199

(58) Field of Classification Search ................. 257/343, 257/378, 141, 401, E29.027, E29.031, E29.112, 257/E29.114, E29.116, E29.12, E29.199, 257/E25.029
See application file for complete search history.

(56) References Cited

U.S. PATENT DOCUMENTS

| | | | | |
|---|---|---|---|---|
| 4,989,058 A | * | 1/1991 | Colak et al. | 257/493 |
| 5,072,268 A | * | 12/1991 | Rumennik | 257/378 |
| 5,105,243 A | * | 4/1992 | Nakagawa et al. | 257/328 |
| 5,828,101 A | * | 10/1998 | Endo | 257/330 |
| 6,614,077 B2 | * | 9/2003 | Nakamura et al. | 257/355 |

(Continued)

FOREIGN PATENT DOCUMENTS

JP    4-174561    6/1992

(Continued)

OTHER PUBLICATIONS

D.S. Byeon et al., "The separated shorted-anode insulated gate bipolar transistor with the suppressed negative differential resistance regime," Microelectronics Journal 30 (1999), pp. 571-575.

(Continued)

*Primary Examiner*—Jerome Jackson, Jr.
*Assistant Examiner*—Yu Chen
(74) *Attorney, Agent, or Firm*—McDermott Will & Emery LLP

(57) ABSTRACT

A high-breakdown voltage semiconductor switching device includes a resurf region of a second conductivity type; a base region of a first conductivity type formed to be adjacent to the resurf region; an emitter/source region of the second conductivity type formed in the base region to be spaced from the resurf region; a gate electrode formed to cover a portion of the emitter/source region and a portion of the resurf region; a drain region of the second conductivity type formed in the resurf region to be spaced from the base region; and a collector region of the first conductivity type formed in the resurf region to be spaced from the base region. Furthermore, it includes an electrode connected to the collector region and the drain region and an electrode connected to the base region and the emitter/source region.

14 Claims, 18 Drawing Sheets

U.S. PATENT DOCUMENTS 6,914,298 B1    7/2005   Hamazawa

FOREIGN PATENT DOCUMENTS

| | | |
|---|---|---|
| JP | 6-52791 | 7/1994 |
| JP | 7-153951 | 6/1995 |
| JP | 2629437 B2 | 4/1997 |
| JP | 2001-015741 | 1/2001 |
| JP | 2002-345242 | 11/2002 |
| JP | 2002-345242 A | 11/2002 |
| JP | 2003-218348 | 7/2003 |
| JP | 2005-093809 | 4/2005 |
| JP | 2005-183499 | 7/2005 |

OTHER PUBLICATIONS

Japanese Notice of Reasons for Rejections, w/ English translation thereof, issued in Japanese Patent Application No. JP 2005-305335 dated Jul. 14, 2009.

Japanese Notice of Reasons for Rejection, w/ English translation thereof, issued in Japanese Patent Application No. JP 2005-305336 dated Feb. 2, 2010.

* cited by examiner

A (PRESENT INVENTION)      B      C      D

FIG. 17

| STRUCTURE | A(PRESENT INVENTION) | B | C | D |
|---|---|---|---|---|
| AREA RATIO BETWEEN P+ REGION AND N+ REGION | approx. 1:1 | 2:1 | 1:1 | 1:1 |
| Vch(V) | 3.6 | 4 | 4.2 | 8.2 |
| FALL TIME tf(nsec) | 130 | 350 | 300 | 110 |
| ON RESISTANCE Ron($\Omega$) | 19 | 17.6 | 20.8 | 30 |

HIGH-BREAKDOWN VOLTAGE SEMICONDUCTOR SWITCHING DEVICE AND SWITCHED MODE POWER SUPPLY APPARATUS USING THE SAME

BACKGROUND OF THE INVENTION

The present invention relates to a switched mode power supply apparatus, and more particularly, it relates to a high-breakdown voltage semiconductor switching device used in a switched mode power supply apparatus for repeatedly switching a principal current.

Recently, it is regarded significant to reduce the standby power of electric home appliances from the viewpoint of preventing the global warming, and there are increasing demands for a switched mode power supply apparatus consuming smaller power in a standby mode.

Now, a conventional switched mode power supply apparatus will be described.

FIG. 22 shows an exemplified circuit configuration of the conventional switched mode power supply apparatus. As shown in FIG. 22, the conventional switched mode power supply apparatus includes a primary rectifying/smoothing circuit 111, a main circuit 112, a transformer 104 and a secondary rectifying/smoothing circuit 121.

Specifically, an AC voltage input between input terminals 116 and 117 of the primary rectifying/smoothing circuit 111 is rectified and smoothed by the primary rectifying/smoothing circuit 111 so as to be supplied to the main circuit 112 as an input DC voltage. At this point, the primary rectifying/smoothing circuit 111 includes a diode bridge 131 and an input capacitor 132, so that a voltage having been full-wave rectified by the diode bridge 131 can be smoothed by the input capacitor 132 for supplying the resultant voltage to the main circuit 112.

The main circuit 112 includes a semiconductor switching device 113 and a voltage control circuit 114. The semiconductor switching device 113 and the voltage control circuit 114 can be integrated on one chip. The transformer 104 includes a primary winding 141, and the primary winding 141 and the semiconductor switching device 113 are serially connected to each other, and the input DC voltage is supplied from the primary rectifying/smoothing circuit 111 to this serially connected circuit.

The control terminal of the semiconductor switching device 113 is connected to the voltage control circuit 114, so that the semiconductor switching device 113 can be controlled to be turned on/off in accordance with a gate signal output by the voltage control circuit 114.

The transformer 104 further includes a secondary winding 142 magnetically coupled to the primary winding 141 and a bias winding 143 magnetically coupled to the primary winding 141 and the secondary winding 142. When the semiconductor switching device 113 is switched and a current intermittently passes through the primary winding 141, a voltage is induced in the secondary winding 142 and the bias winding 143.

The second rectifying/smoothing circuit 121 generates a DC output voltage by rectifying and smoothing the voltage induced in the secondary winding 142 and outputs the DC output voltage from output terminals 126 and 127. Specifically, the secondary rectifying/smoothing circuit 121 includes a diode 122, a choke coil 123 and first and second output capacitors 124 and 125. The choke coil 123 and the first and second output capacitors 124 and 125 are connected to one another in a π shape, and the voltage induced in the secondary winding 142 is half-wave rectified by the diode 122 and is smoothed by the choke coil 123 and the first and second output capacitors 124 and 125.

A voltage generated on the both ends of the bias winding 143 is input to the control terminal of the semiconductor switching device 113 through the voltage control circuit 114. In other words, the switched mode power supply apparatus of FIG. 22 employs a ringing choke converter (RCC) system, and the semiconductor switching device 113 performs a switching operation in a self-excited manner by using the voltage generated in the bias winding 143.

A voltage between the output terminals 126 and 127 is fed back to the voltage control circuit 114 through a photo coupler 129. For example, in the case where the voltage between the output terminals 126 and 127 is lowered, the voltage control circuit 114 forcedly increases an on period of the semiconductor switching device 113, and on the contrary, in the case where the voltage between the output terminals 126 and 127 is increased, the voltage control circuit 114 forcedly reduces an on period of the semiconductor switching device 113. Thus, the voltage appearing between the output terminals 126 and 127 is kept at a given value.

Within the voltage control circuit 114, an auxiliary DC voltage is generated by using the voltage induced in the bias winding 143, and therefore, the voltage control circuit 114 is operated by the auxiliary DC voltage except for the starting time of the switched mode power supply apparatus.

In the starting time of the switched mode power supply apparatus, namely, when the AC voltage is applied between the input terminals 116 and 117, the semiconductor switching device 113 is not in a switching operation, and hence, no voltage is induced in the bias winding 143 and no power is supplied to the voltage control circuit 114. Accordingly, in order to start the switching operation of the semiconductor switching device 113, a low voltage sufficient for activating the voltage control circuit 114 is supplied from the primary rectifying/smoothing circuit 111 through an externally provided resistance 151 (with a high breakdown voltage and high power).

In the aforementioned switched mode power supply apparatus, loss is mainly caused in the semiconductor switching device 113. Generally, a MOSFET (metal oxide semiconductor field effect transistor) is used as the switching device 113. In general, switching loss caused in turn off is large in a bipolar transistor but the switching loss is small in a MOSFET because its switching speed is high. In contrast, a MOSFET has large conducting resistance differently from a bipolar transistor and hence its conducting loss cannot be ignored. Accordingly, when a large current passes through a MOSFET, large loss is caused.

Recently, also in the technical field of switched mode power supply apparatuses, an attention is paid to a bipolar type IGBT (insulated gate bipolar transistor) obtained by implanting minority carriers into a drift layer as compared with a unipolar type MOSFET. In the conventional switched mode power supply apparatus of FIG. 22, if an IGBT is used as the switching device 113, although the conducting resistance is smaller because conductivity modulation is caused as in using a bipolar transistor, the switching speed is lowered and the switching loss is increased because minority carriers are used.

In the switched mode power supply apparatus of the RCC system described above, in the case where a load connected to the output terminals 126 and 127 is heavy, the switching frequency of the switching device 113 is lowered and an on period of the switching device 113 is increased, and as a result, a large current passes through the primary winding 141 so as to keep the voltage between the output terminals 126 and 127 at a given value. On the contrary, when the load is light as in a standby mode, the switching frequency of the switching device 113 is increased and an on period is reduced, and as a result, the current passing through the primary winding 141 is reduced so as to keep the voltage between the output terminals 126 and 127 at a given value.

Accordingly, comprehensively considering both of the switching loss and the conducting loss, when the load is heavy, the frequency is lowered and the current is increased, and therefore, a MOSFET is disadvantageous and an IGBT is advantageous. On the contrary, when the load is light as in a standby mode, the frequency is increased and the current is reduced, and therefore, a MOSFET is advantageous and an IGBT is disadvantageous.

FIG. 23 is a diagram for showing the comparison, in the relationship between load and loss, between a MOSFET (of a lateral type having a drift region with a resurf structure) and an IGBT (of a lateral type) used in a switched mode power supply apparatus. As shown in FIG. 23, when the output is lower (the load is lighter), the switching frequency is increased and hence the loss caused in the IGBT is larger, but when the output is higher (the load is heavier), the switching frequency is lowered and hence the loss caused in the MOSFET is larger.

Patent Document 1: Japanese Laid-Open Patent Publication No. 7-153951

Patent Document 2: Japanese Laid-Open Patent Publication No. 2002-345242

Patent Document 3: Japanese Patent Publication No. 6-52791 (U.S. Pat. No. 5,072,268)

Non-patent Document 1: D. S. Byeon et al., The separated shorted-anode insulated gate bipolar transistor with the suppressed negative differential resistance regime, Microelectronics Journal 30, 1999, pp. 571-575

SUMMARY OF THE INVENTION

As described above, in the case where a MOSFET is used as the switching device, the conducting loss is large when the load is heavy, and in the case where an IGBT is used as the switching device, the switching loss is large in the standby mode or when the load is light. Accordingly, it is difficult to reduce the loss in the whole region ranging from light load to heavy load in a conventional semiconductor switching device.

In consideration of the aforementioned conventional problem, an object of the invention is providing a high-breakdown voltage semiconductor switching device whose loss can be reduced in the whole region ranging from light load to heavy load and a switched mode power supply apparatus using the same.

In order to achieve the object, namely, in order to reduce the loss in the whole region ranging from light load to heavy load, the present inventors have examined proper use of two kinds of transistors, namely, a MOSFET and an IGBT, in one switched mode power supply apparatus.

Patent Document 1 proposes an architecture where a vertical IGBT and a vertical power MOSFET are both provided in one chip of a switching device. In this architecture, however, the current power of the vertical power MOSFET is too small as compared with the driving power of the vertical IGBT, and as a result, it is practically difficult to drive the power MOSFET when the load is light. Furthermore, in this architecture, a step should be formed on the back face of a semiconductor substrate, and hence, the fabrication process is difficult.

Also, Patent Document 2 proposes an architecture where an IGBT of a Schottky junction type is used as the switching device. In the IGBT of the Schottky junction type, however, the loss caused when the load is light is larger than that of a power MOSFET, and the loss caused when the load is heavy is larger than that of a conventional IGBT. Therefore, this architecture of Patent Document 2 cannot always reduce the loss.

Moreover, the switching device described in any of Patent Documents 1 and 2 has a vertical structure. Therefore, when such a vertical switching device is used as the semiconductor switching device 113 of, for example, the conventional switched mode power supply apparatus of FIG. 22, there arises another problem that it is difficult to build the voltage control circuit 114 and the semiconductor switching device 113 in one chip.

Patent Document 3 and Non-patent Document 1 propose shorted-anode lateral IGBTs serving as an intermediate between the MOSFET and the IGBT, though their object is not to achieve the use of two kinds of a MOSFET and an IGBT in one element.

FIG. 24 is a cross-sectional view for showing one example of a shorted-anode lateral IGBT disclosed in Patent Document 3. In the structure shown in FIG. 24, a $P^+$-type pocket 514 and an $N^+$-type pocket 515 are shorted through a drain electrode 513. In this shorted-anode lateral IGBT, when positive voltage is applied to a gate electrode 512 by positive bias between the drain electrode 513 and a source electrode 505, the current starts flowing from the $N^+$-pocket 515 to a source electrode 505 via an $N^+$-type source region 507 (MOSFET operation). When the potential of an N-type well region 503 located below the $P^+$-type pocket 514 is lowered by approximately 0.6 V as compared with the $P^+$-type pocket 514, the holes are injected from the $P^+$-type pocket 514 to the N-type well region 503 for the IGBT operation. During turn-off of the gate signal, the electrons are discharged from the N-type well region 503 to the $N^+$-type pocket 515, which means that the shorted-anode lateral IGBT shown in FIG. 24 has fast switching speed characteristics. Furthermore, when this switching element with the lateral structure is employed to the semiconductor switching element 113 shown in FIG. 22, for example, the voltage control circuit 114 and the semiconductor switching element 113 can be built in one chip.

Employment of the shorted-anode lateral IGBT shown in FIG. 24 as a switching element, however, less reduces the loss in the whole region ranging from light load to heavy load. The reason therefor is that: this switching element is difficult to transfer its mode from the MOSFET operation to the IGBT operation unless the length 523 of the $P^+$-type pocket 514 is increased, resulting in the MOSFET operation in a load region where the IGBT operation is favorable intrinsically to cause an increase in loss. In contrast, when the length 523 of the $P^+$-type pocket 514 is increased, the potential difference between the $P^+$-type pocket 514 and the N-type well 503 is apt to be caused, leading to smooth transfer to the IGBT operation. The increase in the length 523 of the $P^+$-type pocket 514, however, consumes the unit area of the element to increase ON resistance of the element in both the MOSFET operation and the IGBT operation, increasing the loss.

Thus, it is still difficult in practice to reduce the loss in the whole region ranging from light load to heavy load even if the shorted-anode lateral IGBT as shown in FIG. 24 is employed as a switching source device.

In view of the above knowledge, the present inventors have reached the invention of a lateral high-breakdown semiconductor switching element described below. Namely, the invention achieves a switching element which is capable of switching between a MOSFET and an IGBT by a single element, which reduces the loss in the whole region ranging from light load to heavy load, and which can be built in one chip together with a control circuit and the like.

Specifically, the first high-breakdown voltage semiconductor switching device of this invention includes a resurf region of a second conductivity type formed in a surface portion of a semiconductor substrate of a first conductivity type; a base region of the first conductivity type formed in the semiconductor substrate to be adjacent to the resurf region; an emitter/source region of the second conductivity type formed in the base region to be spaced from the resurf region; a gate insulating film formed over the base region to cover a portion of the emitter/source region and a portion of the resurf region; a gate electrode formed on the gate insulating film; a drain region of the second conductivity type formed in the resurf region to be spaced from the base region; a collector region of the first conductivity type formed in the resurf region to be spaced from the base region; a collector/drain electrode formed on the semiconductor substrate and electrically connected to the collector region and the drain region; and an emitter/source electrode formed on the semiconductor substrate and electrically connected to the base region and the emitter/source region.

In the first high-breakdown voltage semiconductor switching device of this invention, a MOSFET operation can be performed when a collector current passing through the device is comparatively small and an IGBT operation can be performed when the collector current becomes large. Thus, two kinds of transistors, that is, a MOSFET and an IGBT, can be properly used in one device. Accordingly, the MOSFET operation can be performed in a standby mode or when load is light and the IGBT operation can be performed when the load is heavy, so that loss can be reduced in a whole region ranging from light load to heavy load in the high-breakdown voltage semiconductor switching device.

Furthermore, in the first high-breakdown voltage semiconductor switching device of this invention, since an extended drain region (that corresponds to, for example, an N-type resurf region 202 of Embodiment 1 described below and is a region for principally keeping a breakdown voltage) has a resurf structure, the resistance obtained in the MOSFET operation can be lowered by the resurf layer with a high impurity concentration. Therefore, as compared with a conventional lateral device, a large collector (drain) current can be allowed to pass in the MOSFET operation.

Moreover, since the first high-breakdown voltage semiconductor switching device of this invention is a lateral device in which a collector electrode (collector/drain electrode) and an emitter electrode (emitter/source electrode) are provided on the same principal face of a substrate, it can be built on one chip together with a gate signal control circuit or the like.

In the first high-breakdown voltage semiconductor switching device of the invention, each of the collector region and the drain region preferably includes a plurality of sections separated from one another, and the sections of the collector region and the sections of the drain region are preferably alternately arranged to be in contact with one another along a vertical direction to a direction extending from the collector region toward the emitter/source region.

Thus, change in length of each section of the collector region allows the MOSFET operation to be changed to the IGBT operation easily without inviting an increase in element area as compared with the case where the respective sections of the collector region and the respective sections of the drain region are arranged, for example, along the direction extending from the collector region toward the emitter/source region.

In this case, when each section of the collector region has a length of 48 µm or less along the vertical direction to the direction extending from the collector region toward the emitter/source region, a fall time tf can be shortened as compared with the case where the length of each section of the collector region is larger than 48 µm, and hence, switching loss can be thus reduced. Also, as compared with the case where the length of each section of the collector region is larger than 48 µm, the collector voltage Vch at which the MOSFET operation is changed to the IGBT operation can be increased, and hence, a more practical light-loaded MOSFET operation can be performed.

Also in this case, arrangement of the sections of the collector region and the sections of the drain region is preferably terminated by a terminating portion corresponding to a part of the drain region, a second drain region of the second conductivity type is preferably formed in the resurf region to be spaced from the base region, a second drain electrode electrically connected to the second drain region is preferably formed on the semiconductor substrate, the second drain region is preferably electrically connected to the terminating portion of the drain region through the resurf region, and at least a part of a portion of the resurf region disposed between the second drain region and the terminating portion of the drain region preferably has a smaller width than other portions, whereby pinching off a current path from the terminating portion of the drain region to the second drain region through an electric field effect when a voltage exceeding a given value is applied to the collector/drain electrode. Thus, even when a high voltage is applied to the collector electrode (collector/drain electrode), a voltage appearing on the second drain electrode can be pinched off (lowered) by a depletion layer expanding from the semiconductor substrate to the resurf region. Accordingly, when the voltage of the second drain electrode is pinched off, for example, to approximately 10 V, the second drain electrode can be connected to a device of a low voltage circuit for supplying power to the device.

In the first high-breakdown voltage semiconductor switching device of this invention, a buffer layer of the second conductivity type having a higher impurity concentration than the resurf region is preferably provided between the collector region and the resurf region.

Thus, the efficiency for injecting holes from the collector region into the resurf region is reduced, and hence, for example, the fall time tf can be improved to be shorter.

In the first high-breakdown voltage semiconductor switching device of this invention, one or a plurality of semiconductor layers of the first conductivity type electrically connected to the base region are preferably formed in the resurf region.

Thus, as compared with the case where no semiconductor layer of the first conductivity type is formed, the impurity concentration of the resurf region can be increased, and hence, the conducting resistance obtained in the MOSFET operation is reduced. As a result, the collector (drain) current passing in the MOSFET operation can be further increased, so that a more practical light-loaded MOSFET operation can be performed. In addition, since holes can be withdrawn from the semiconductor layer(s) of the first conductivity type in turn off in the IGBT operation, the fall time tf can be shortened. Furthermore, since the impurity concentration of the resurf region can be increased, the life time of holes in the resurf region can be shortened, so as to shorten the fall time tf.

The switched mode power supply apparatus of this invention includes a semiconductor switching device to which an input DC voltage is applied; a voltage control circuit for controlling switching of the semiconductor switching device; a primary winding electrically connected to an output terminal of the semiconductor switching device; a secondary winding magnetically coupled to the primary winding; and a rectifying/smoothing circuit for rectifying and smoothing a voltage induced in the secondary winding for supplying an output DC voltage to a load, and the semiconductor switching device is the first high-breakdown voltage semiconductor switching device of the invention.

Since the switched mode power supply apparatus of this invention uses the first high-breakdown voltage semiconductor switching device of this invention, switching loss can be reduced by performing the MOSFET operation when load is light and conducting loss can be reduced by performing the IGBT operation when the load is heavy. Accordingly, the loss can be reduced in the whole region ranging from light load to heavy load in the switched mode power supply apparatus.

In the first high-breakdown voltage semiconductor switching device of the invention used in the switched mode power supply apparatus of this invention, each of the collector region and the drain region preferably includes a plurality of sections separated from one another, and the sections of the collector region and the sections of the drain region are preferably alternately arranged to be in contact with one another along a vertical direction to a direction extending from the collector region toward the emitter/source region. Also, in the first high-breakdown voltage semiconductor switching device, arrangement of the sections of the collector region and the sections of the drain region is preferably terminated by a terminating portion corresponding to a part of the drain region, a second drain region of the second conductivity type is preferably formed in the resurf region to be spaced from the base region, a second drain region electrically connected to the second drain region is preferably formed on the semiconductor substrate, the second drain region is preferably electrically connected to the terminating portion of the drain region through the resurf region, and at least a part of a portion of the resurf region disposed between the second drain region and the terminating portion of the drain region preferably has a smaller width than other portions, whereby pinching off a current path from the terminating portion of the drain region to the second drain region through an electric field effect when a voltage exceeding a given value is applied to the collector/drain electrode. Furthermore, the switched mode power supply apparatus of this invention preferably further includes a starting circuit for starting the voltage control circuit, and the second drain electrode of the high-breakdown voltage semiconductor switching device is preferably electrically connected to the starting circuit.

Thus, a low bias starting voltage necessary in power supply can be generated within the high-breakdown voltage semiconductor switching device, and therefore, a power supply apparatus can be constructed without using a high-breakdown voltage and high-power resistance for power supply that is conventionally necessary.

The switched mode power supply apparatus of the invention preferably further includes a bias winding magnetically coupled to the primary winding and the secondary winding, and the switched mode power supply apparatus preferably employs a ringing choke converter system in which a voltage induced in the bias winding is applied to a gate terminal of the semiconductor switching device through the voltage control circuit.

Thus, the switching frequency is increased when the load is light and is reduced when the load is heavy, and therefore, the first high-breakdown voltage semiconductor switching device of this invention that performs the MOSFET operation when the load is light and performs the IGBT operation when the load is heavy can be more effectively used.

The second high-breakdown voltage semiconductor switching device of this invention includes a resurf region of a second conductivity type formed in a surface portion of a semiconductor substrate of a first conductivity type; a base region of the first conductivity type formed in the semiconductor substrate to be adjacent to the resurf region; an emitter/source region of the second conductivity type formed in the base region to be spaced from the resurf region; a gate insulating film formed over the base region to cover a portion of the emitter/source region and a portion of the resurf region; a gate electrode formed on the gate insulating film; a drain region of the second conductivity type formed in the resurf region to be spaced from the base region; a first collector region of the first conductivity type formed in the resurf region to be spaced from the base region; a second collector region of the first conductivity type formed in the resurf region to be spaced from the base region; a collector/drain electrode formed on the semiconductor substrate and electrically connected to the first collector region, the second collector region and the drain region; and an emitter/source electrode formed on the semiconductor substrate and electrically connected to the base region and the emitter/source region, and each of the first collector region, the second collector region and the drain region includes a plurality of sections separated from one another, each section of the first collector region has a given length X1 along a vertical direction to a direction extending from the drain region toward the emitter/source region, each section of the second collector region has a given length X2 shorter than the length X1 along the vertical direction, and the sections of the first collector region, the sections of the second collector region and the sections of the drain region are arranged along the vertical direction in such a manner that each section of the drain region is sandwiched between and in contact with a section of the first collector region and a section of the second collector region.

In the second high-breakdown voltage semiconductor switching device of this invention, the following effects can be attained in addition to the same effects as those attained by the first high-breakdown voltage semiconductor switching device of this invention: When a collector voltage at which a MOSFET operation is changed to an IGBT operation is indicated by Vch, the voltage Vch can be determined in accordance with the length X1 of each section of the first collector region larger than the length X2 of each section of the second collector region. Also, owing to the second collector region including the sections each having the length X2 smaller than the length X1 of each section of the first collector region, the total area of the whole collector region can be suppressed, so as to shorten the fall time tf caused in turn off. Accordingly, both of the voltage Vch and the fall time tf can be suppressed, so as to improve a trade-off relationship between the voltage Vch and the fall time tf.

In the second high-breakdown voltage semiconductor switching device of the invention, the number of sections of the first collector region is preferably smaller than the number of sections of the second collector region.

Thus, since the number of sections of the first collector region with a relatively large length is smaller than the number of sections of the second collector region with a relatively short length, the total area of the whole collector region can be further suppressed, so as to further shorten the fall time tf caused in turn off.

In the second high-breakdown voltage semiconductor switching device of this invention, the first collector region is preferably composed of a third collector region including a plurality of sections each having a given length Z along the vertical direction and a fourth collector region including a plurality of sections each having a given length X1-Z along the vertical direction, and a portion of the resurf region not connected to the collector/drain electrode is preferably sandwiched between and in contact with a section of the third collector region and a section of the fourth collector region along the vertical direction.

Thus, since a portion of the resurf region not connected to the collector/drain electrode is disposed between a section of the third collector region and a section of the fourth collector region, a wiring made of, for example, polysilicon can be formed above the portion of the resurf region. In other words, the design freedom for the circuit pattern can be improved without degrading the device performance.

In the case where the portion of the resurf region is sandwiched between one section of the third collector region and one section of the fourth collector region, the collector/drain electrode is preferably drawn onto an interlayer film formed above the resurf region, the high-breakdown voltage semiconductor switching device preferably further includes a drain electric field reducing layer formed between the interlayer film and the resurf region and electrically connected to the collector/drain electrode, and at least a part of the drain electric field reducing layer is preferably disposed below a portion of the collector/drain electrode drawn onto the interlayer film and disposed above the portion of the resurf region sandwiched between a section of the third collector region and a section of the fourth collector region. Thus, when the drain electric field reducing layer made of, for example, polysilicon is formed above the portion of the resurf region, the design freedom for the circuit pattern can be improved and the area occupied by the drain electric field reducing layer can be reduced.

In the case where the drain electric field reducing layer is formed above the portion of the resurf region sandwiched between a section of the third collector region and a section of the fourth collector region, the drain electric field reducing layer is preferably connected to the collector/drain electrode above the portion of the resurf region sandwiched between a section of the third collector region and a section of the fourth collector region. Thus, since the drain electric field reducing layer and the collector/drain electrode are connected above the portion of the resurf region, the design freedom for the circuit pattern can be improved and the contact area between the drain electric field reducing layer and the collector/drain electrode can be reduced.

As described so far, the present invention relates a high-breakdown voltage semiconductor switching device and a switched mode power supply apparatus using the same and is very useful because it attains a special effect to reduce loss in the whole region ranging from light load to heavy load.

BRIEF DESCRIPTION OF THE DRAWINGS

FIG. 17 is a table of measured characteristics of the high-breakdown voltage semiconductor switching device of Embodiment 5 compared with measured characteristics of another high-breakdown voltage semiconductor switching device;

DETAILED DESCRIPTION OF THE INVENTION

Embodiment 1

A lateral high-breakdown voltage semiconductor switching device and a switched mode power supply apparatus using the same according to Embodiment 1 of the invention will now be described with reference to the accompanying drawings.

Figure 1:
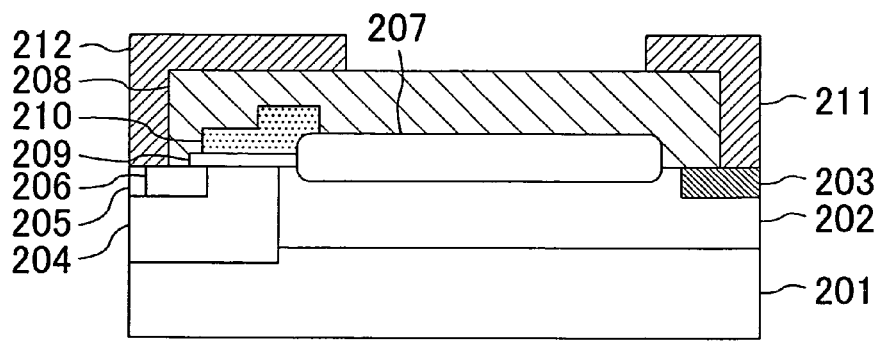
FIG. 1 is a cross-sectional view of a high-breakdown voltage semiconductor switching device according to Embodiment 1 of the invention.
Figure 2:
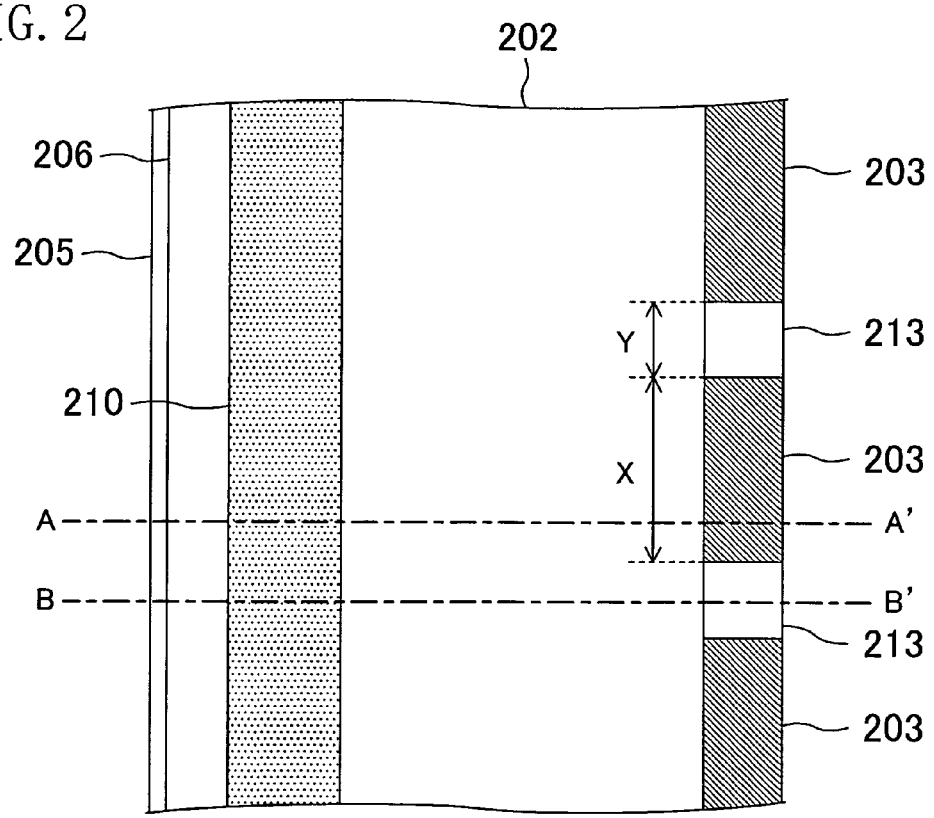
FIG. 2 is a plan view of the high-breakdown voltage semiconductor switching device according to Embodiment 1 of the invention.
Figure 3:
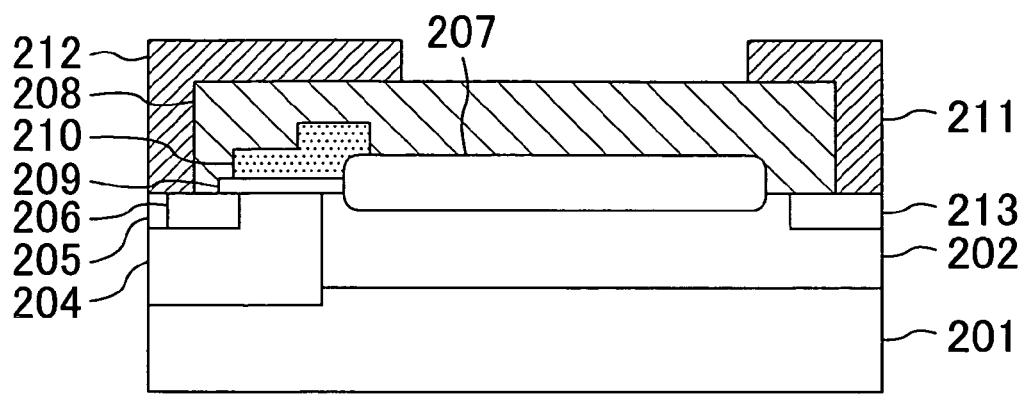
FIG. 3 is another cross-sectional view of the high-breakdown voltage semiconductor switching device according to Embodiment 1 of the invention.

FIGS. 1 through 3 are diagrams for showing an exemplified architecture of the high-breakdown voltage semiconductor switching device of this embodiment, and specifically, FIG. 2 is a plan view thereof, FIG. 1 is a cross-sectional view thereof taken on line A-A' of FIG. 2 and FIG. 3 is a cross-sectional view thereof taken on line B-B' of FIG. 2. It is noted that part of composing elements is omitted in FIG. 2.

In the high-breakdown voltage semiconductor switching device of this embodiment shown in FIGS. 1 through 3, an N-type resurf region 202 with a concentration of, for example, approximately $1 \times 10^{16}/cm^3$ and a depth of approximately 7 μm is formed in a surface portion of a P⁻ type semiconductor substrate 201 with a concentration of, for example, approximately $1 \times 10^{14}/cm^3$. Also, a p-type base region 204 with a concentration of, for example, approximately $1 \times 10^{17}/cm^3$ is formed in the semiconductor substrate 201 to be adjacent to the resurf region 202. In the base region 204, a P⁺ type contact region 205 with a concentration of, for example, approximately $1 \times 10^{19}/cm^3$ and an N⁺ type emitter/source region 206 with a concentration of, for example, approximately $1 \times 10^{20}/cm^3$ are formed to be adjacent to each other and spaced from the resurf region 202. At this point, the contact region 205 is farther from the resurf region 202 than the emitter/source region 206. A gate insulating film 209 is formed over the base region 204 so as to cover a portion of the emitter/source region 206 and at least an end portion of the resurf region 202. A gate electrode 210 is formed on the gate insulating film 209.

Also, as shown in FIG. 1, a p⁺ type collector region 203 with a concentration of, for example, approximately $1 \times 10^{19}/cm^3$ is formed in the resurf region 202 to be spaced from the base region 204, and as shown in FIG. 3, an N⁺ type drain region 213 with a concentration of, for example, approximately $1 \times 10^{20}/cm^3$ is formed in the resurf region 202 to be spaced from the base region 204. At this point, as shown in FIG. 2, each of the collector region 203 and the drain region 213 includes a plurality of sections separated from one another, and the respective sections of the collector region 203 and the respective sections of the drain region 213 are alternately arranged to be in contact with one another along a vertical direction to a direction extending from the collector region 203 toward the emitter/source region 206. Furthermore, when the length of each section of the collector region 203 along the vertical direction is indicated by X, the length X is, for example, approximately 40 μm, and when the length of each section of the drain region 213 along the vertical direction is indicated by Y, the length Y is, for example, approximately 10 μm.

Furthermore, as shown in FIGS. 1 and 3, a collector/drain electrode 211 electrically connected to both of the collector region 203 and the drain region 213 is formed on the semiconductor substrate 201, and an emitter/source electrode 212 electrically connected to both of the base region 204 and the emitter/source region 206 is formed on the semiconductor substrate 201. The emitter/source electrode 212 is electrically connected to the base region 204 through the contact region 205. Also, an interlayer film 208 is formed above the resurf region 202 with a field insulating film 207 sandwiched therebetween, and the collector/drain electrode 211 and the emitter/source electrode 212 are drawn onto the interlayer film 208.

Figure 6:
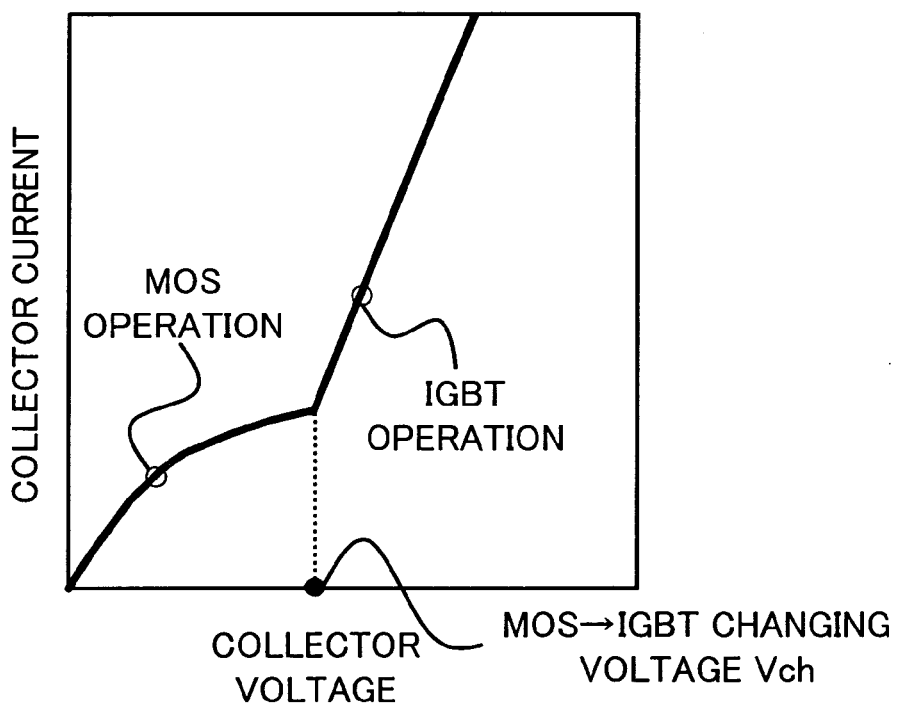
FIG. 6 is a diagram for showing the correlation between a collector voltage and a collector current in the high-breakdown voltage semiconductor switching device of Embodiment 1.

In the high-breakdown voltage semiconductor switching device of this embodiment, when a positive bias voltage (hereinafter sometimes referred to as a collector voltage) is applied between the collector/drain electrode 211 and the emitter/source electrode 212 and a positive voltage is applied to the gate electrode 210, a current (hereinafter sometimes referred to as a collector current) starts to flow from the drain region 213 to the emitter/source electrode 212 through the resurf region 202, the base region 204 (a portion thereof corresponding to a channel region) and the emitter/source region 206 (which operation is a MOSFET operation). When the collector voltage is increased, the collector current is increased to some extent, and when potential of a portion of the resurf region 202 disposed around the collector region 203 becomes lower than that of the collector region 203 by, for example, approximately 0.6 V, holes start to be injected from the collector region 203 into the resurf region 202, and thus, the MOSFET operation is changed to an IGBT operation. At this point, the collector current flows from the collector region 203 to the emitter/source electrode 212 through the resurf region 202 (or the semiconductor substrate 201), the base region 204 and the contact region 205. FIG. 6 shows the correlation between the collector voltage and the collector current obtained in the high-breakdown voltage semiconductor switching device of this embodiment.

In the high-breakdown voltage semiconductor switching device of this embodiment, when the collector voltage at which the MOSFET operation is changed to the IGBT operation is indicated by Vch, the voltage Vch can be controlled in accordance with the collector region length X shown in FIG. 2 (i.e., the length of each section of the collector region 203 along the vertical direction to the direction extending from the collector region 203 toward the emitter/source region 206). In FIG. 2, the length Y is the drain region length (i.e., the length of each section of the drain region 213 along the vertical direction to the direction extending from the collector region 203 toward the emitter/source region 206).

Figure 7:
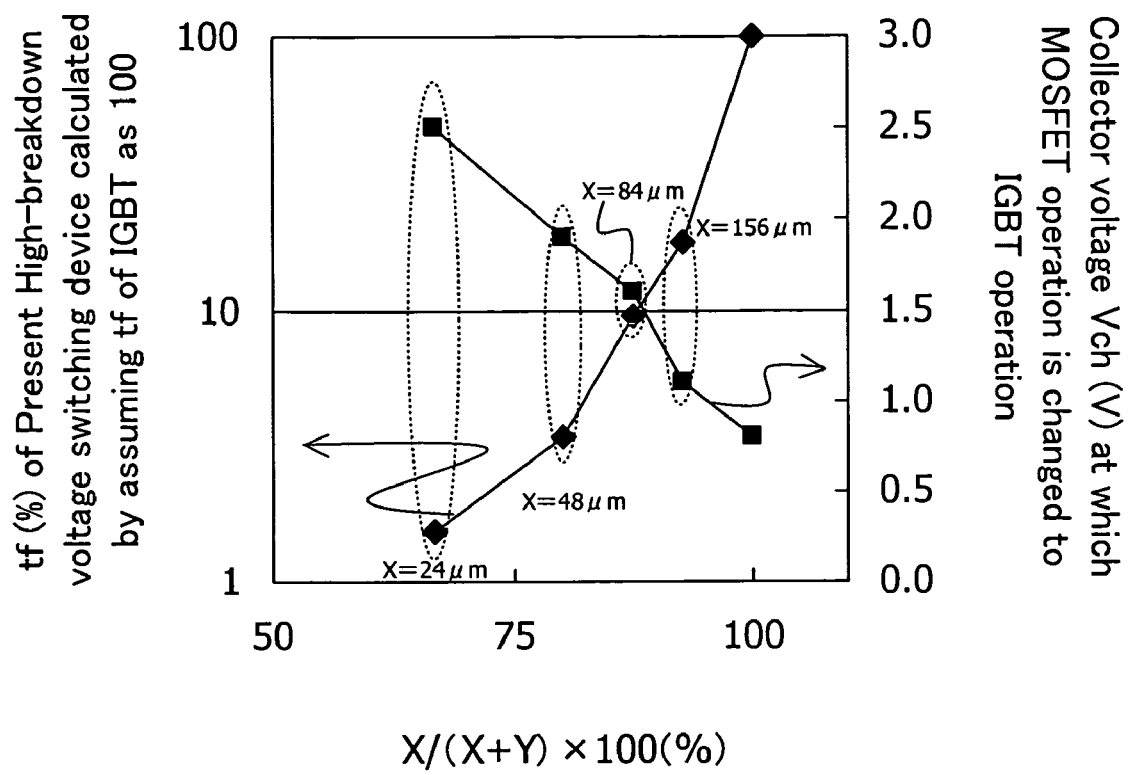
FIG. 7 is a diagram for showing the correlation among a collector region length X, a fall time tf and a collector voltage Vch for changing to an IGBT operation in the high-breakdown voltage semiconductor switching device of Embodiment 1.

FIG. 7 shows the correlation among the collector region length X, a fall time tf caused in turn off (i.e., a time required after turn off for the collector current to reduce (change) from 90% of its peak value to 10%) and the voltage Vch obtained in the high-breakdown voltage semiconductor switching device of this embodiment. As shown in FIG. 7, when the collector region length X is reduced, the efficiency for injecting holes is reduced and hence the fall time tf is shortened. Also, when the collector region length X is reduced, a potential difference is minimally caused between the collector region 203 and the resurf region 202 surrounding it, and hence the voltage Vch is increased. On the contrary, when the collector region length X is increased, the voltage Vch is reduced. Furthermore, as the collector region length X is shorter, the fall time tf is shorter and the switching loss is smaller. It is noted that the voltage Vch should be approximately 2 V or more for realizing a practical light-loaded MOSFET operation. Accordingly, in the high-breakdown voltage semiconductor switching device of this embodiment, the collector region length X is preferably designed to be 48 μm or less.

In this manner, the high-breakdown voltage semiconductor switching device of this embodiment can be made to perform the MOSFET operation when the collector current passing therethrough is comparatively small and to perform the IGBT operation when the collector current is large. Therefore, two kinds of transistors, namely, the MOSFET and the IGBT, can be properly used in one device. Accordingly, the MOSFET operation can be performed in a standby mode or when load is light and the IGBT operation can be performed when the load is heavy. Thus, a high-breakdown voltage semiconductor switching device whose loss can be reduced in the whole region ranging from light load to heavy load can be realized.

Also, since the high-breakdown voltage semiconductor switching device of this embodiment uses the N-type resurf region 202, the conducting resistance obtained in the MOSFET operation can be lowered by the resurf region 202 with a high impurity concentration. Therefore, as shown in FIG. 6, a larger collector (drain) current can be allowed to pass in the MOSFET operation than in a conventional lateral device.

Moreover, in the high-breakdown voltage semiconductor switching device of this embodiment, each of the collector region 203 and the drain region 213 includes a plurality of separated sections, and the respective sections of the collector region 203 and the respective sections of the drain region 213 are alternately arranged to be in contact with one another along the vertical direction to the direction extending from the collector region 203 toward the emitter/source region 206. Accordingly, the MOSFET operation is changed to the IGBT operation easily without inviting an increase in element area. Specifically, in the case where the respective sections of the collector region 203 and the respective sections of the drain region 213 are arranged, for example, along the direction extending from the collector region 203 toward the emitter/source region 206 differently from this embodiment, the MOSFET operation is hardly changed to the IGBT operation unless the length of the collector region 203 in the direction extending toward the emitter/source region 206 is made large. As a result, the MOSFET operation is performed in the load range where the IGBT operation is preferable primarily, thereby increasing the loss. In reverse, when the length of the collector region 203 in the direction extending toward the emitter/source region 206 is made large, potential difference is liable to be caused between the collector region 203 and the resurf region 202, causing easy change to the IGBT operation. In this case, however, an area of each element increases to increase ON resistance of the elements in both the MOSFET operation and the IGBT operation, increasing the loss.

In contrast, in this embodiment providing the aforementioned structure of the collector region 203 and the drain region 231, the length X of the collector region 203 is changed, enabling easy change from the MOSFET operation to the IGBT operation without inviting an increase in element area.

Moreover, since the high-breakdown voltage semiconductor switching device of this embodiment is a lateral device in which the collector/drain electrode 211 and the emitter/source electrode 212 are provided on the same principal face of the semiconductor substrate 201, it can be built on one chip together with a gate signal control circuit or the like.

In the high-breakdown voltage semiconductor switching device of this embodiment, each of the collector region 203 and the drain region 213 includes a plurality of separated sections and the respective sections of the collector region 203 and the respective sections of the drain region 213 are alternately disposed to be in contact with one another along the vertical direction to the direction extending from the collector region 203 toward the emitter/source region 206. Instead, both or one of the collector region 203 and the drain region 213 may be formed as a single region. Also, the arrangement of the sections of the collector region 203 and the drain region 213 is not particularly specified excluding the arrangement in which the MOSFET operation can be easily changed to the IGBT operation as described above.

Figure 4:
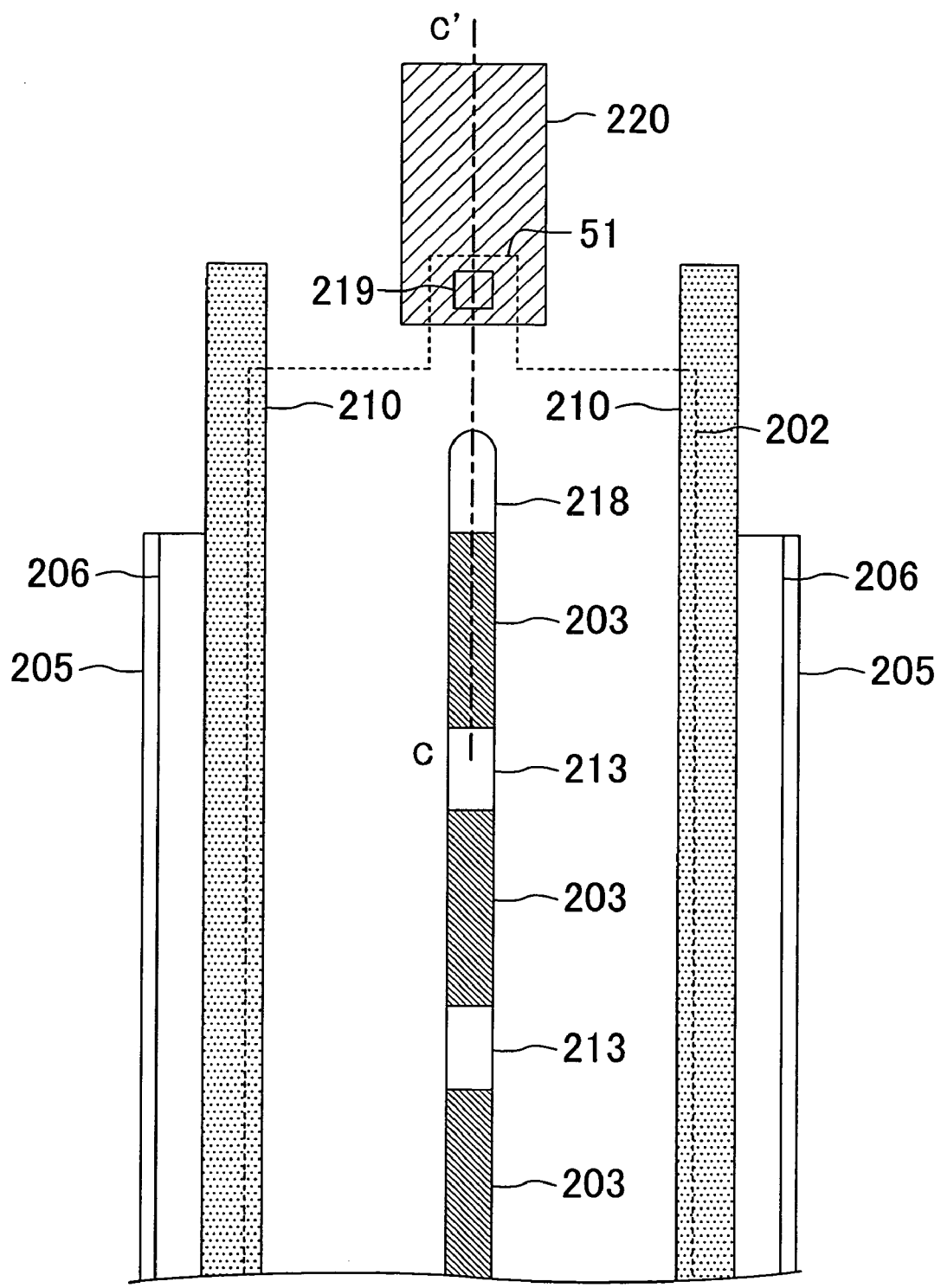
FIG. 4 is a plan view of a JFET portion of the high-breakdown voltage semiconductor switching device of Embodiment 1.
Figure 5:
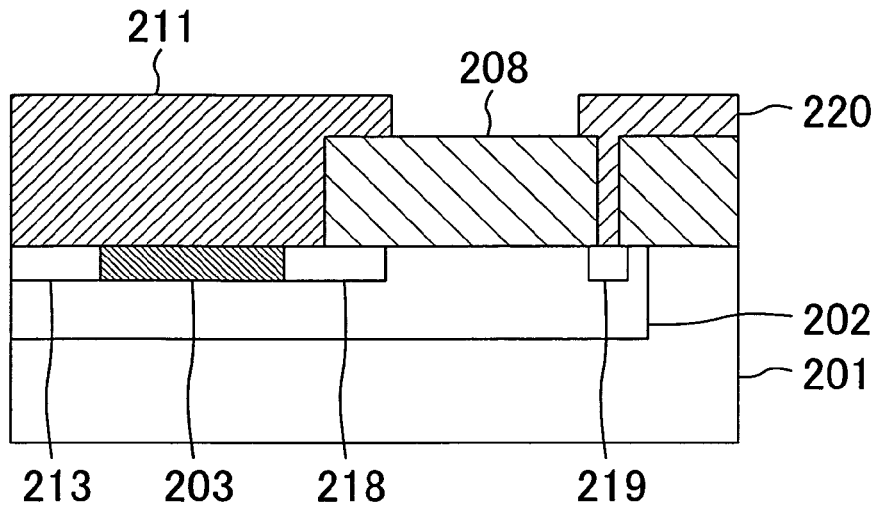
FIG. 5 is a cross-sectional view of the JFET portion of the high-breakdown voltage semiconductor switching device of Embodiment 1.

FIG. 4 is a plan view of the high-breakdown voltage semiconductor switching device of this embodiment for showing a region not shown in the plan view of FIG. 2, and FIG. 5 is a cross-sectional view thereof taken on line C-C' of FIG. 4.

As shown in FIGS. 4 and 5, the arrangement of the respective sections of the collector region 203 and the respective sections of the drain region 213 is terminated by an $N^+$ type drain region (terminating drain region) 218 with a concentration of, for example, approximately $1 \times 10^{20}/cm^3$ corresponding to a part of the drain region 213. Also, an $N^+$ type second drain region 219 with a concentration of, for example, approximately $1 \times 10^{20}/cm^3$ is formed in the resurf region 202 to be spaced from the base region 204. A second drain electrode 220 electrically connected to the second drain region 219 is formed on the semiconductor substrate 201. The second drain electrode 220 is drawn onto the interlayer film 208. The second drain region 219 and the terminating drain region 218 are electrically connected to each other through the resurf region 202. At this point, at least a part of a portion 51 of the resurf region 202 disposed between the second drain region 219 and the terminating drain region 218 (hereinafter referred to as a JFET junction field effect transistor) portion) has a smaller width than other portions. Therefore, in the case where a voltage exceeding a given value is applied to the collector/drain electrode 211, the current path extending from the terminating drain region 218 to the second drain region 219 is pinched off through the electric field effect.

In the high-breakdown voltage semiconductor switching device of this embodiment, owing to the architecture shown in FIGS. 4 and 5, even when a high voltage is applied to the collector/drain electrode 211, a voltage appearing on the second drain electrode 220 can be pinched off (lowered) by a depletion layer extending from the semiconductor substrate 201 to the resurf region 202. Accordingly, when the voltage of the second drain electrode 220 is pinched off to, for example, approximately 10 V, the second drain electrode 220 can be connected to a device of a low voltage circuit for supplying power to the device.

Figure 8:
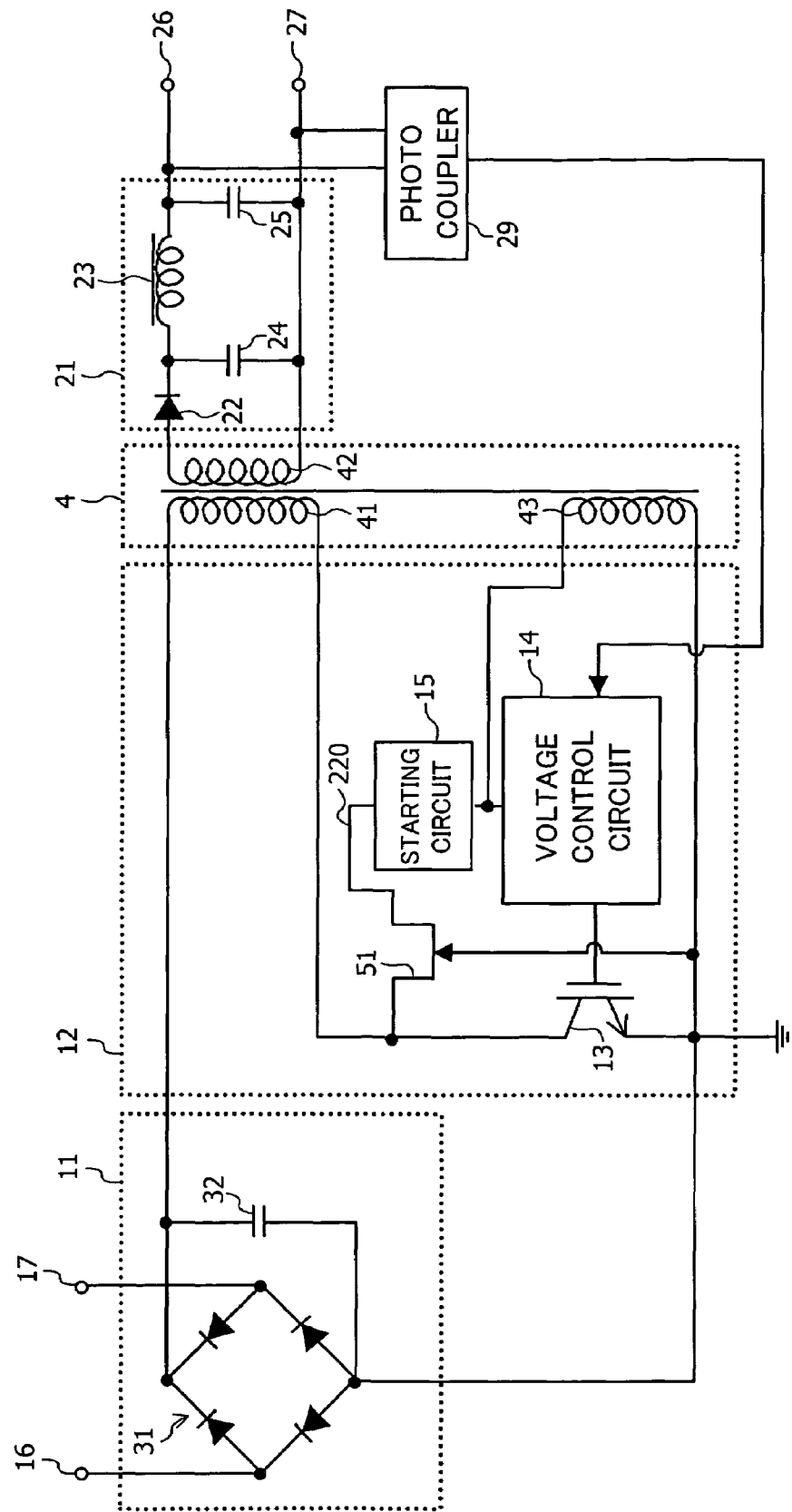
FIG. 8 is a diagram for showing an exemplified circuit configuration of a switched mode power supply apparatus according to Embodiment 1 of the invention.

FIG. 8 shows an exemplified circuit configuration of a switched mode power supply apparatus using the high-breakdown voltage semiconductor switching device of this embodiment shown in FIGS. 1 through 5. As shown in FIG. 8, the switched mode power supply apparatus of this embodiment employs the ringing choke converter (RCC) system, and includes a primary rectifying/smoothing circuit 11, a main circuit 12, a transformer 4 and a secondary rectifying/smoothing circuit 21.

Specifically, the primary rectifying/smoothing circuit 11 includes a diode bridge 31 and an input capacitor 32, and input terminals 16 and 17 of the primary rectifying/smoothing circuit 11 are connected to a commercial power supply. An AC voltage applied between the input terminals 16 and 17 is full-wave rectified by the diode bridge 31 and the rectified voltage is input to the input capacitor 32 to be smoothed, thereby generating an input DC voltage (to be supplied to the main circuit 12).

The main circuit 12 includes a high-breakdown voltage semiconductor switching device 13 of this embodiment and a voltage control circuit 14. At this point, the switching device 13 of this embodiment, the voltage control circuit 14, a starting circuit 15 described below, the high-breakdown voltage JFET portion 51 and the second drain electrode 220 extending from the JFET portion 51 to the starting circuit 15 are all integrated on one chip. The transformer 4 includes a primary winding 41, one end of the primary winding 41 is connected to the collector/drain electrode 211 of the switching device 13 of this embodiment, and the other end of the primary winding 41 is connected to a high-side terminal of the input capacitor 32 of the primary rectifying/smoothing circuit 11. Also, the emitter/source electrode 212 of the switching device 13 is connected to a ground-side terminal of the input capacitor 32, so that the input DC voltage input from the primary rectifying/smoothing circuit 11 can be applied to a serially connected circuit composed of the primary winding 41 and the switching device 13.

The transformer 4 further includes a secondary winding 42 magnetically coupled to the primary winding 41 and a bias winding 43 magnetically coupled to the primary winding 41 and the secondary winding 42. In other words, the transformer 4 has a structure in which a voltage is induced in the secondary winding 42 and the bias winding 43 when a current intermittently passes through the primary winding 41.

The voltage induced in the bias winding 43 is input to the gate electrode 210 of the switching device 13 through the voltage control circuit 14. In other words, the switched mode power supply apparatus of FIG. 8 is constructed to cause self-oscillation by the voltage induced in the bias winding 43. When the switching device 13 is switched by the self-oscillation, a current intermittently passes through the primary winding 41 so as to induce a voltage in the secondary winding 42 and the bias winding 43.

The secondary rectifying/smoothing circuit 21 includes a rectifier diode 22, a choke coil 23 and first and second output capacitors 24 and 25. One end of the secondary winding 42 is connected to the anode terminal of the rectifier diode 22, and the cathode terminal of the rectifier diode 22 is connected to a high-side terminal of the first output capacitor 24. Furthermore, the cathode terminal of the rectifier diode 22 is also connected to one end of the choke coil 23, and the other end of the choke coil 23 is connected to a high-side output terminal 26. The other end of the secondary winding 42 is connected to a low-side output terminal 27, which is also connected to a low-side output terminal of the first output capacitor 24 and a low-side output terminal of the second output capacitor 25. The polarity of the voltage induced in the secondary winding 42 is set to polarity for applying a positive voltage to the anode terminal of the rectifier diode 22 when the switching device 13 is turned off, and at this point, the rectifier diode 22 is forward biased to allow a current to pass.

The current passing through the rectifier diode 22 charges the first output capacitor 24, and passes through the choke coil 23 to charge the second output capacitor 25. In the case where a load is connected between the output terminals 26 and 27, the current passing through the choke coil 23 is also supplied to the load. In this condition, the voltage induced in the secondary winding 42 is smoothed by the first and second output capacitors 24 and 25 and the choke coil 23.

When the switching device 13 is turned on, a voltage for reverse biasing the rectifier diode 22 is induced in the secondary winding 42, and hence, no current passes through the rectifier diode 22. In this condition, a current is supplied to the load connected between the output terminals 26 and 27 by electrostatic energy stored in the first and second output capacitors 24 and 25 and magnetic energy stored in the choke coil 23.

Also, the voltage between the output terminals 26 and 27 is fed back to the voltage control circuit 14 through a photo coupler 29. The voltage control circuit 14 controls an on period of the switching device 13 in accordance with the amplitude of the voltage input from the photo coupler 29. Specifically, when the voltage between the output terminals 26 and 27 is lowered, the voltage control circuit 14 increases an on period of the switching device 13, and when the voltage between the output terminals 26 and 27 is increased, it forcedly reduces an on period of the switching device 13. In this manner, the voltage appearing between the output terminals 26 and 27 is kept at a given value.

In a state where a voltage is induced in the secondary winding 42, a voltage is also induced in the bias winding 43. Within the voltage control circuit 14, an auxiliary DC voltage is generated by using the voltage induced in the bias winding 43, and the voltage control circuit 14 is operated by the auxiliary DC voltage except for the starting time of the switched mode power supply apparatus.

Since the switching device 13 is not in a switching operation in the starting time of the switched mode power supply apparatus, however, no voltage is induced in the bias winding 43 and hence no power is supplied to the voltage control circuit 14. In this condition, when a voltage is supplied from an AC power supply to the input terminals 16 and 17, part of a DC current having been generated in the primary rectifying/smoothing circuit 11 and having passed through the primary winding 41 of the transformer 4 reaches the voltage control circuit 14 through the high-breakdown voltage JFET portion 51, the second drain electrode 220 and the starting circuit 15, so as to activate the voltage control circuit 14. Thus, since the switching device 13 repeats the switching operation, a voltage is induced in the secondary winding 42 of the transformer 4, and hence, the voltage control circuit 14 is placed in a steady operation state.

Figure 22:
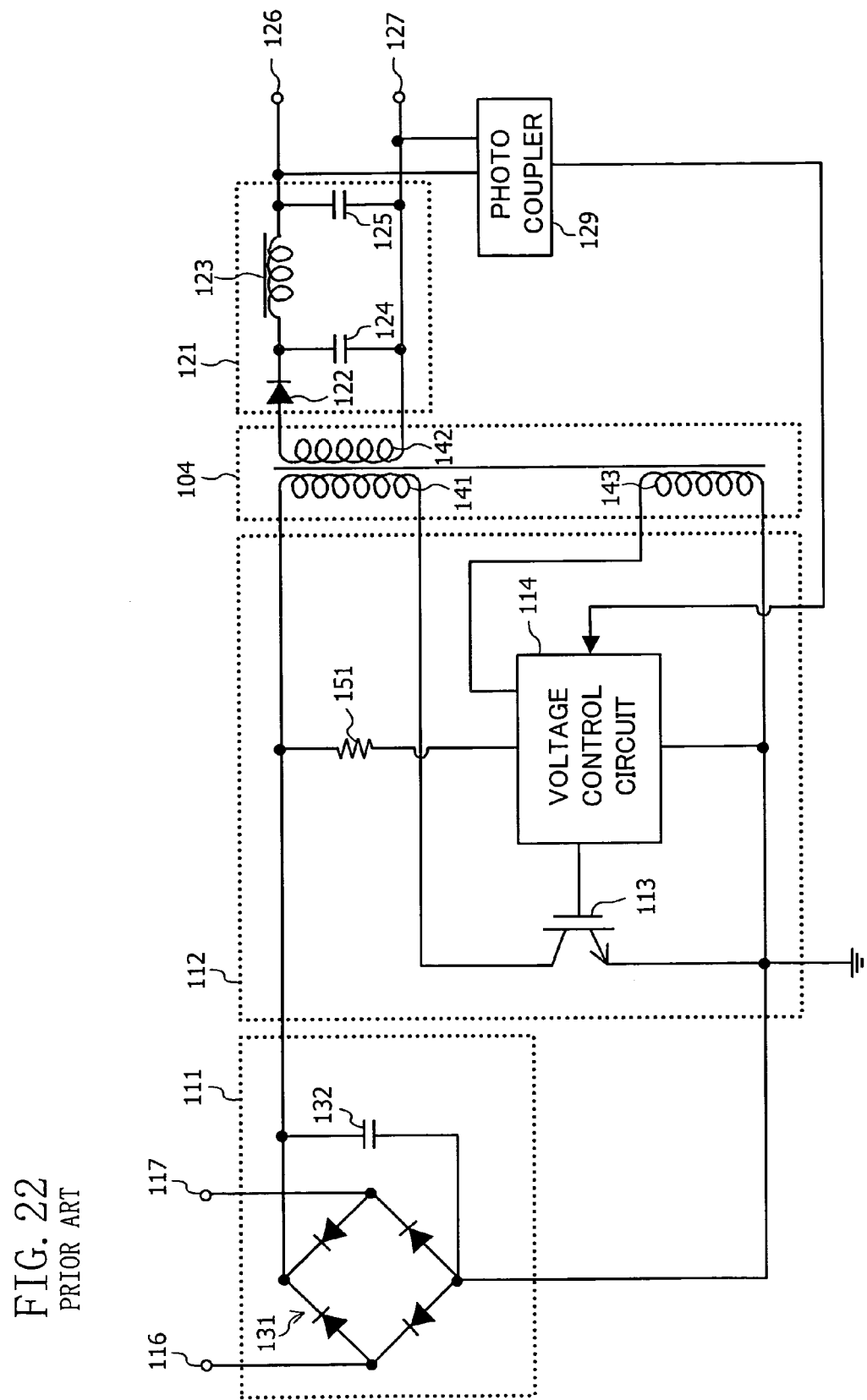
FIG. 22 is a diagram for showing an exemplified circuit configuration of a conventional switched mode power supply apparatus.

In this manner, when the high-breakdown voltage semiconductor switching device of this embodiment is used in the switched mode power supply apparatus, a low starting voltage necessary at the time of power supply can be generated in the high-breakdown voltage JFET portion 51, and therefore, there is no need to provide a high-breakdown voltage and high-power resistance (such as the resistance 151 of FIG. 22) that is conventionally necessary for power supply. As a result, wiring can be simplified, the cost can be reduced and the power supply circuit can be made compact.

Furthermore, in the switched mode power supply apparatus of this embodiment, in the case where the load connected between the output terminals 26 and 27 is heavy, the switching frequency of the switching device 13 is lowered and the on period of the switching device 13 is increased, so as to allow a large current to pass through the primary winding 41. Thus, the voltage between the output terminals 26 and 27 is kept at a given value. On the contrary, when the load is light as in a standby mode, the switching frequency of the switching device 13 is increased and the on period of the switching device 13 is reduced, so as to reduce the current passing through the primary winding 41. Thus, the voltage between the output terminals 26 and 27 is kept at a given value.

Figure 9:
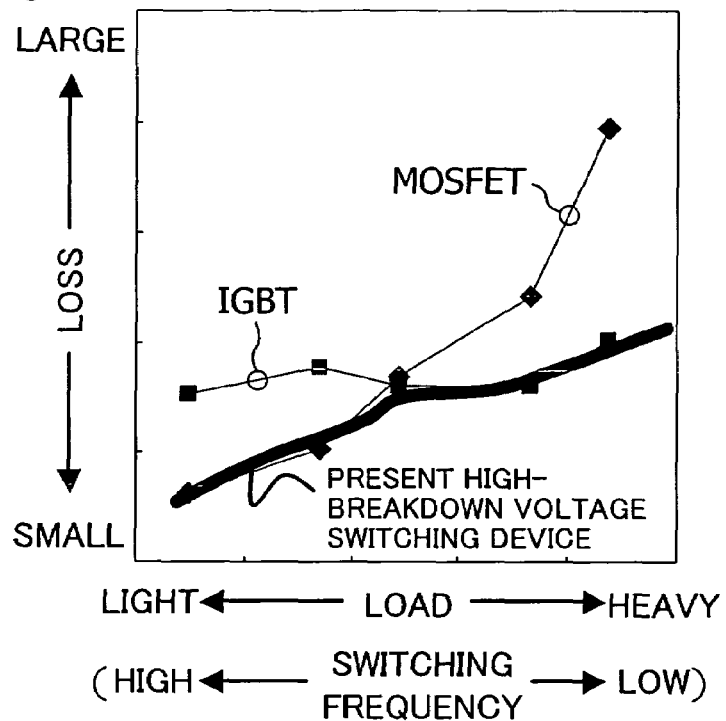
FIG. 9 is a diagram for showing the relationship between load and loss obtained when the high-breakdown voltage semiconductor switching device of Embodiment 1 is used in the switched mode power supply apparatus.
Figure 23:
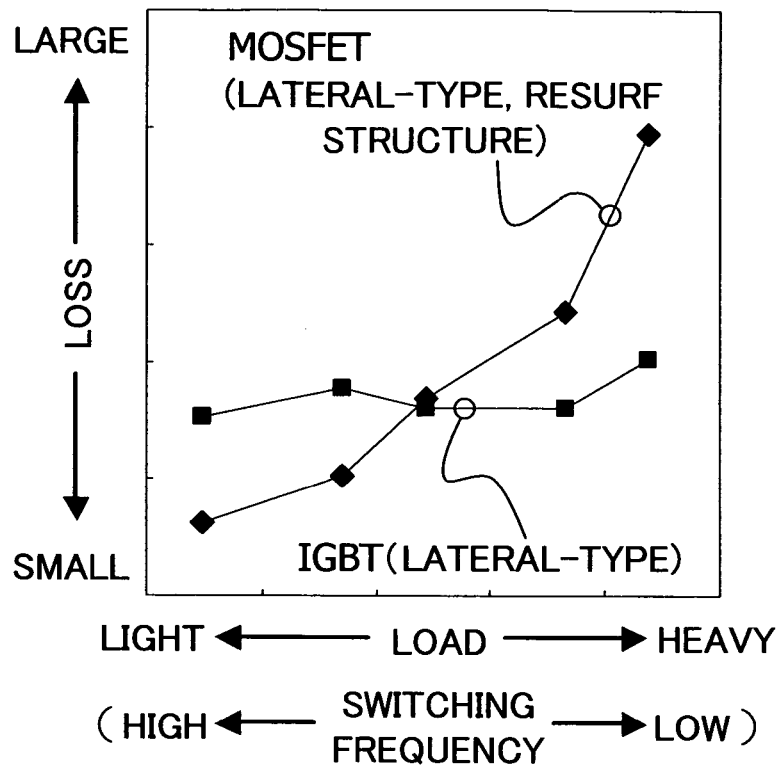
FIG. 23 is a diagram for showing the comparison, in the relationship between load and loss, between a MOSFET (of a lateral type having a drift region with a resurf structure) and an IGBT (of a lateral type) used in a switched mode power supply apparatus.
Figure 24:
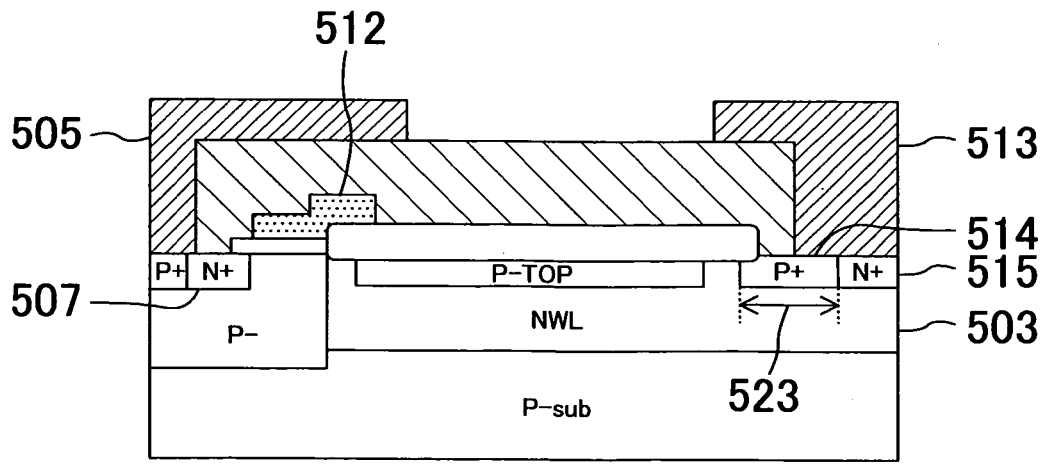
FIG. 24 is a cross-sectional view for showing one example of a conventional shorted-anode lateral IGBT.

The switched mode power supply apparatus of this embodiment uses the high-breakdown voltage semiconductor switching device of this embodiment as the switching device 13. Therefore, as shown in FIG. 9 (with a thick line), when the load is light, the switching loss can be reduced by performing the MOSFET operation, and when the load is heavy, the conducting loss can be reduced by performing the IGBT operation. Accordingly, the effect to reduce the loss in the whole region ranging from light load to heavy load can be achieved. It is noted that the losses of the MOSFET and the IGBT shown in FIG. 23 are also shown in FIG. 9 for comparison.

Moreover, since the switched mode power supply apparatus of this embodiment employs the RCC system, the switching frequency is increased when the load is light and is reduced when the load is heavy. Therefore, the high-breakdown voltage semiconductor switching device of this embodiment that performs the MOSFET operation when the load is light and performs the IGBT operation when the load is heavy can be more effectively used.

Embodiment 2

A lateral high-breakdown voltage semiconductor switching device and a switched mode power supply apparatus using the same according to Embodiment 2 of the invention will now be described with reference to the accompanying drawing.

Figure 10:
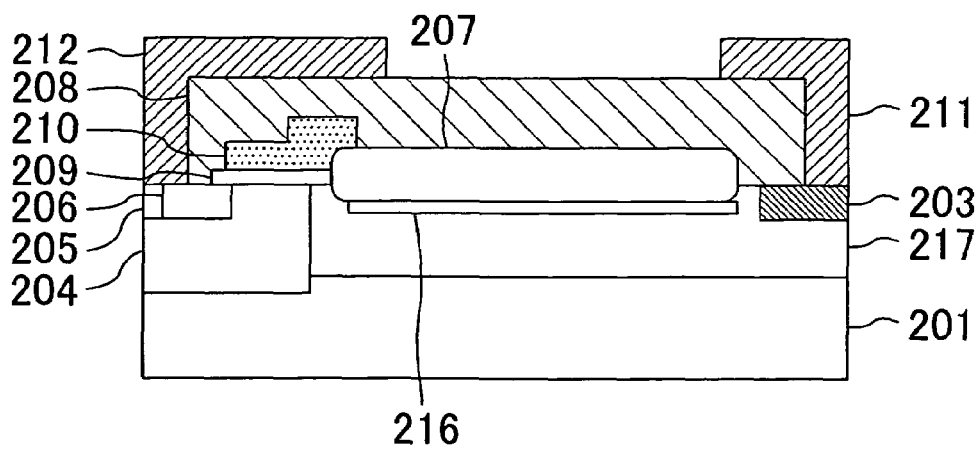
FIG. 10 is a cross-sectional view of a high-breakdown voltage semiconductor switching device according to Embodiment 2 of the invention.

FIG. 10 is a cross-sectional view for showing an exemplified architecture of the high-breakdown voltage semiconductor switching device of this embodiment. As shown in FIG. 10, a difference of the high-breakdown voltage semiconductor switching device of this embodiment from that of Embodiment 1 shown in FIG. 1 is that the resurf region 202 of Embodiment 1 is replaced with an N-type resurf region 217 including a p-type semiconductor layer 216 with a concentration of, for example, approximately $1 \times 10^6/cm^3$. The p-type semiconductor layer 216 is formed in the resurf region 217 directly below the field insulating film 207 (i.e., in a surface portion of the resurf region 217), and is electrically connected to the base region 204 (namely, the emitter/source region 206) in a portion not shown.

According to Embodiment 2, the following effects can be attained in addition to the effects of Embodiment 1: Since a depletion layer is easily expanded in the resurf region 217 under application of reverse bias, the resurf region 217 can be formed to have a higher impurity concentration than, for example, the resurf region 202 of Embodiment 1 shown in FIG. 1. When the concentration of the resurf region 217 is thus increased, the conducting resistance obtained in the MOSFET operation can be reduced, and hence, a larger collector (drain) current can be allowed to pass. In other words, when the high-breakdown voltage semiconductor switching device of this embodiment is used in a switched mode power supply apparatus, a practical light-loaded MOSFET operation can be realized. In addition, since holes can be withdrawn from the p-type semiconductor layer 216 at the time of turn off in the IGBT operation, the fall time tf can be shortened. Furthermore, when the impurity concentration of the resurf region 217 is high, the lifetime of the hole is shortened in the resurf region 217, so as to further shorten the fall time tf.

Although the p-type semiconductor layer 216 is singly provided in the resurf region 217 in this embodiment, a plurality of p-type semiconductor layers may be provided instead.

Embodiment 3

A lateral high-breakdown voltage semiconductor switching device and a switched mode power supply apparatus using the same according to Embodiment 3 of the invention will now be described with reference to the accompanying drawing.

Figure 11:
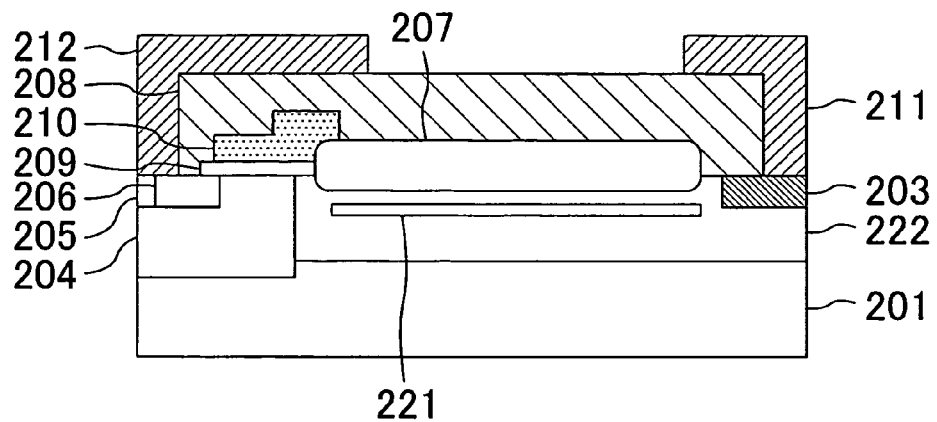
FIG. 11 is a cross-sectional view of a high-breakdown voltage semiconductor switching device according to Embodiment 3 of the invention.

FIG. 11 is a cross-sectional view for showing an exemplified architecture of the high-breakdown voltage semiconductor switching device of this embodiment. As shown in FIG. 11, a difference of the high-breakdown voltage semiconductor switching device of this embodiment from that of Embodiment 2 shown in FIG. 10 is that the resurf region 217 of Embodiment 2 is replaced with an N-type resurf region 222 including a p-type semiconductor layer 221 with a concentration of, for example, approximately $1 \times 10^{16}/cm^3$ and formed in a deeper portion. Specifically, the p-type semiconductor layer 221 is formed in a position deeper than that of the p-type semiconductor layer 216 in the resurf region 217 of Embodiment 2, and is electrically connected to the base region 204 (namely, the emitter/source region 206) in a portion not shown in the same manner as in Embodiment 2.

According to Embodiment 3, a depletion layer is further easily expanded in the resurf region 222 under application of reverse bias than in Embodiment 2 shown in FIG. 10, and therefore, the resurf region 222 can be formed to have a further higher impurity concentration than the resurf region 217 of Embodiment 2. As a result, the same effects as those of Embodiment 2 can be more remarkably attained.

Although the p-type semiconductor layer 221 is singly provided in the resurf region 222 in this embodiment, a plurality of p-type semiconductor layers may be provided instead.

Embodiment 4

A lateral high-breakdown voltage semiconductor switching device and a switched mode power supply apparatus using the same according to Embodiment 4 of the invention will now be described with reference to the accompanying drawing.

Figure 12:
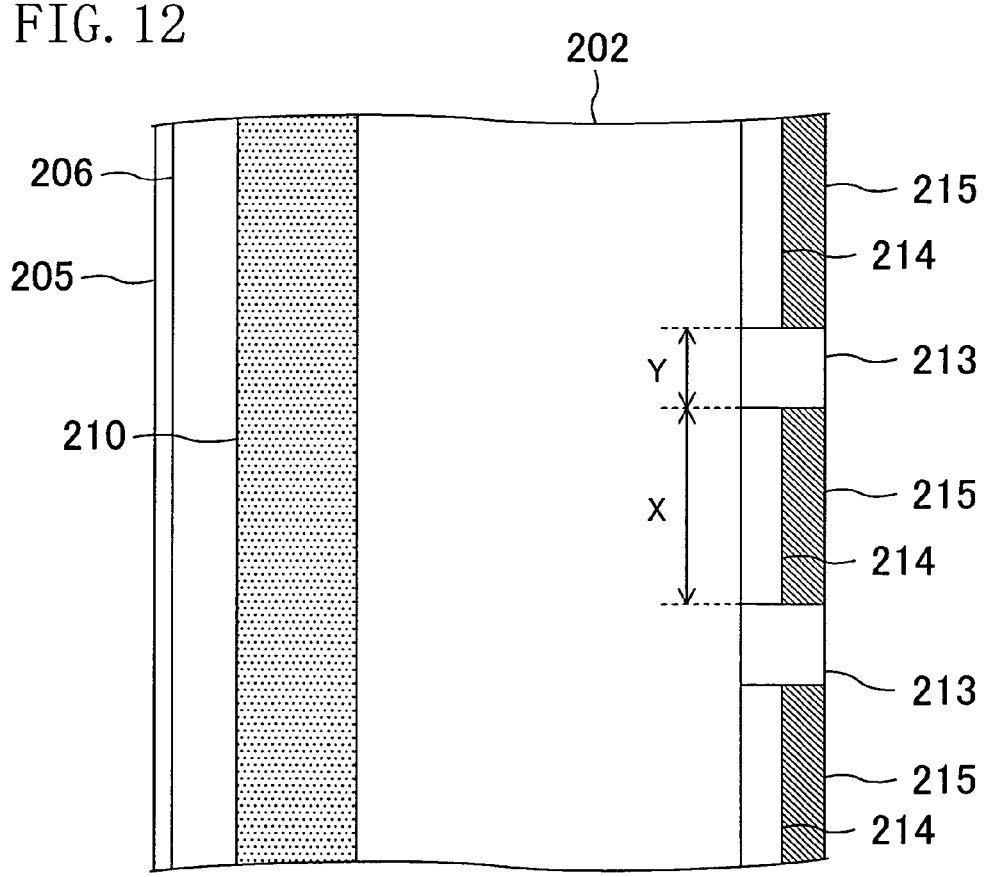
FIG. 12 is a plan view of a high-breakdown voltage semiconductor switching device according to Embodiment 4 of the invention.

FIG. 12 is a plan view for showing an exemplified architecture of the high-breakdown voltage semiconductor switching device of this embodiment. As shown in FIG. 12, differences of the high-breakdown voltage semiconductor switching device of this embodiment from that of Embodiment 1 shown in FIGS. 1 through 3 are that the $p^+$ type collector region 203 of Embodiment 1 is replaced with a $p^+$ type collector region 215 with a concentration of, for example, approximately $1 \times 10^{19}/cm^3$ having a smaller width than the $p^+$ type collector region 203 and that an N-type buffer layer 214 with an impurity concentration of, for example, approximately $1 \times 10^{17}/cm^3$ higher than that in the resurf region 202 is provided between the $p^+$ type collector region 215 and the resurf region 202. In other words, the N-type buffer layer 214 is formed around the collector region 215 of this embodiment.

According to Embodiment 4, since the efficiency for injecting holes into the resurf region 202 from the collector region 215 is reduced, for example, the fall time tf can be improved to be shorter.

Although a modification on the side of the collector of the semiconductor switching device of this invention is described in this embodiment, it goes without saying that the invention may be variously modified within the true spirit and scope of the invention.

Furthermore, although the semiconductor switching device of this invention is provided on the P-type semiconductor substrate 201 including the N-type resurf region 202, 217 or 222 in each of Embodiments 1 through 4, the semiconductor switching device of this invention may be provided on an N-type semiconductor substrate including a P-type resurf region instead.

Embodiment 5

A lateral high-breakdown voltage semiconductor switching device according to Embodiment 5 of the invention will now be described with reference to the accompanying drawings.

In the high-breakdown voltage semiconductor switching device of Embodiment 1, there is a trade-off relationship between the collector voltage Vch at which the MOSFET operation is changed to the IGBT operation and the fall time tf caused in turn off in the IGBT operation as shown in FIG. 7. In other words, when the collector region length X is reduced, the efficiency for injecting holes is reduced so as to shorten the fall time tf. Also, when the collector region length X is reduced, a potential difference is minimally caused between the collector region 203 and the portion of the resurf region 202 disposed around it, and hence the collector voltage Vch is increased. On the contrary, when the collector region length X is increased, although the collector voltage Vch is reduced, the efficiency for injecting holes is increased so as to increase the fall time tf. Accordingly, when a desired low collector voltage Vch is to obtain in Embodiment 1, the fall time tf is unavoidably increased, and therefore, the switching loss caused in a heavy-loaded IGBT operation cannot be sufficiently reduced.

Accordingly, this embodiment aims to realize a high-breakdown voltage semiconductor switching device capable of (1) changing the MOSFET operation to the IGBT operation when the collector voltage Vch reaches a desired small value; and (2) further reducing a loss caused in heavy load by shortening the fall time tf caused in turn off in the IGBT operation, namely, capable of improving the trade-off relationship between the collector voltage Vch and the fall time tf.

Figure 13:
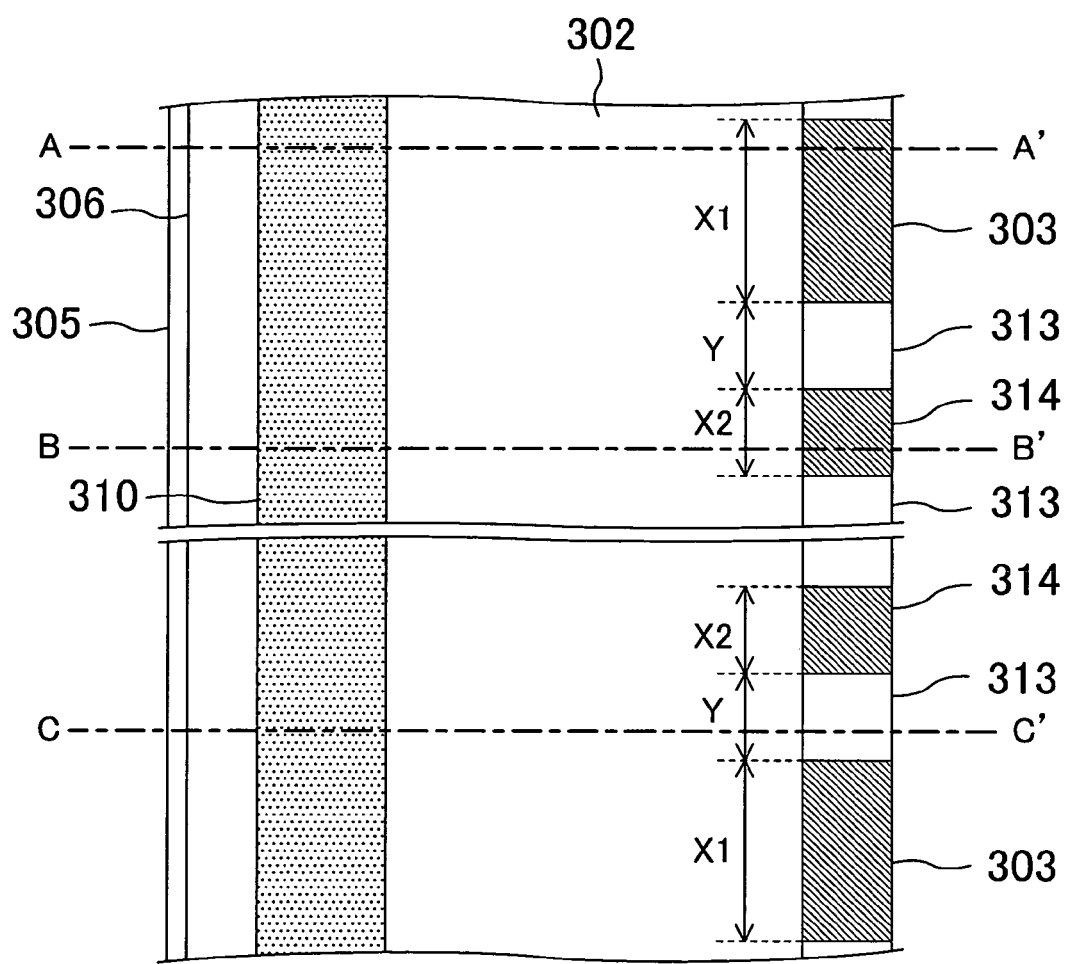
FIG. 13 is a plan view of a high-breakdown voltage semiconductor switching device according to Embodiment 5 of the invention.
Figure 14A:
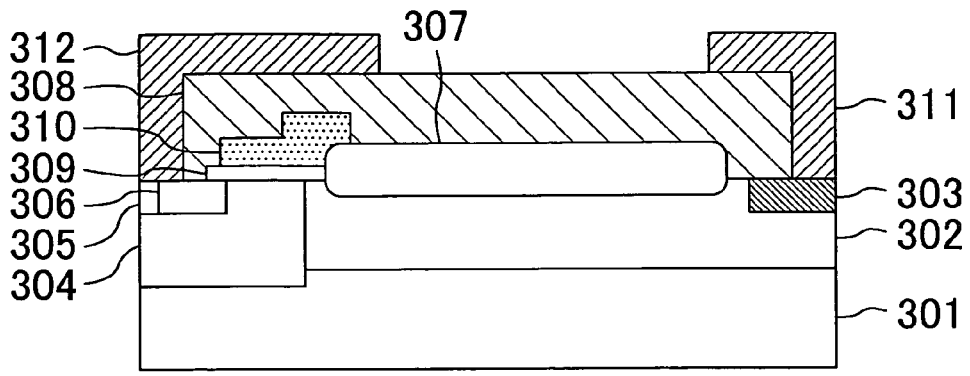
FIGS. 14A, 14B and 14C are cross-sectional views of the high-breakdown voltage semiconductor switching device according to Embodiment 5 of the invention.
Figure 14B:
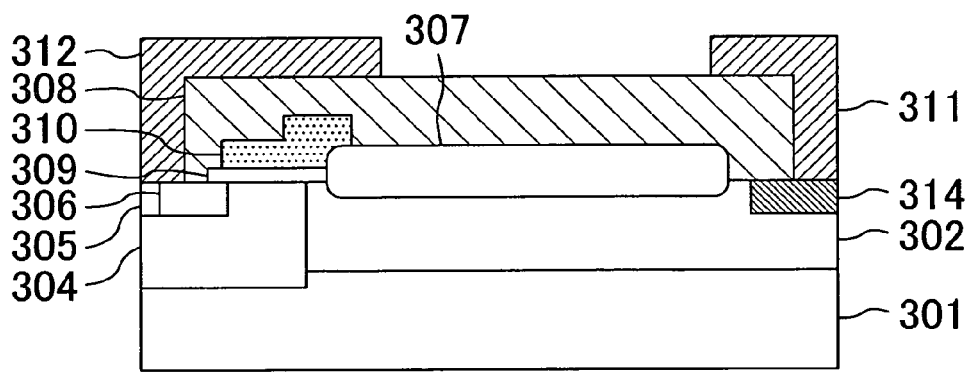
Figure 14C:
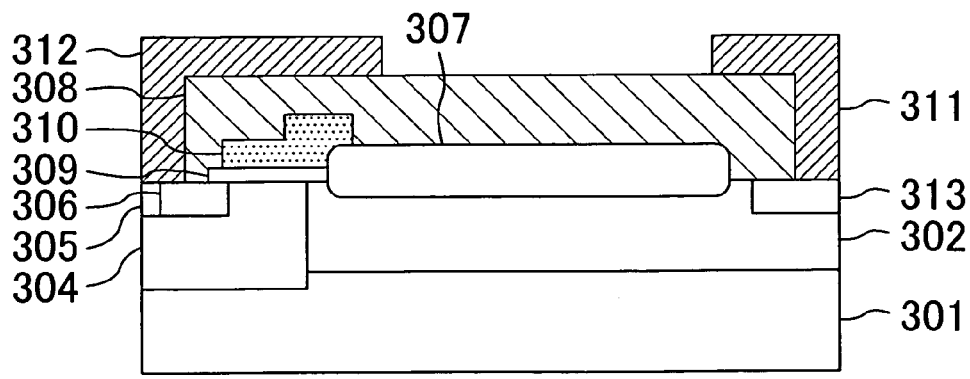

FIGS. 13 and 14A through 14C are diagrams for showing an exemplified architecture of the high-breakdown voltage semiconductor switching device of this embodiment, and specifically, FIG. 13 is a plan view thereof, FIG. 14A is a cross-sectional view thereof taken on line A-A' of FIG. 13, FIG. 14B is a cross-sectional view thereof taken on line B-B' of FIG. 13 and FIG. 14C is a cross-sectional view thereof taken on line C-C' of FIG. 13. It is noted that part of composing elements is omitted in FIG. 13.

In the high-breakdown voltage semiconductor switching device of this embodiment shown in FIGS. 13 and 14A through 14C, an N-type resurf region 302 with a concentration of, for example, approximately $1\times10^{16}/cm^3$ and a depth of approximately 7 μm is formed in a surface portion of a P⁻ type semiconductor substrate 301 with a concentration of, for example, approximately $1\times10^{14}/cm^3$. Also, a p-type base region 304 with a concentration of, for example, approximately $1\times10^{17}/cm^3$ is formed in the semiconductor substrate 301 to be adjacent to the resurf region 302. In the base region 304, a P⁺ type contact region 305 with a concentration of, for example, $1\times10^{19}/cm^3$ and an N⁺ type emitter/source region 306 with a concentration of, for example, approximately $1\times10^{20}/cm^3$ are formed to be adjacent to each other and spaced from the resurf region 302. A gate insulating film 309 is formed over the base region 304 so as to cover a portion of the emitter/source region 306 and at least an end portion of the resurf region 302. A gate electrode 310 is formed on the gate insulating film 309.

Furthermore, as shown in FIGS. 14A and 14B, a p⁺ type first collector region 303 with a concentration of, for example, approximately $1\times10^{19}/cm^3$ and a p⁺ type second collector region 314 with a concentration of, for example, approximately $1\times10^{19}/cm^3$ are formed in the resurf region 302 to be spaced from the base region 304, and as shown in FIG. 14C, an N⁺ type drain region 313 with a concentration of, for example, approximately $1\times10^{20}/cm^3$ is formed in the resurf region 302 to be spaced from the base region 304. At this point, each of the first collector region 303, the second collector region 314 and the drain region 313 includes a plurality of sections separated from one another as shown in FIG. 13.

Also, the respective sections of the first collector region 303, the respective sections of the second collector region 314 and the respective sections of the drain region 313 are arranged in a vertical direction to a direction extending from the drain region 313 toward the emitter/source region 306 (hereinafter simply referred to as the vertical direction), so that each section of the drain region 313 is sandwiched between and in contact with one section of the first collector region 303 and one section of the second collector region 314.

In this embodiment, the number of sections of the first collector region 303 and the number of sections of the second collector region 314 can be arbitrarily designed, and in the case where the number of sections of the first collector region 303 is smaller than the number of sections of the second collector region 314, the total area of the whole collector region can be further suppressed, so as to further shorten the fall time tf caused in turn off. Also, when the length of each section of the first collector region 303 along the vertical direction is indicated by X1, the length X1 is, for example, approximately 40 μm. Furthermore, when the length of each section of the second collector region 314 along the vertical direction is indicated by X2, the length X2 is shorter than the length X1 and is, for example, approximately 20 μm. Moreover, when the length of each section of the drain region 313 along the vertical direction is indicated by Y, the length Y is, for example, approximately 20 μm.

Furthermore, as shown in FIGS. 14A through 14C, a collector/drain electrode 311 electrically connected to the first collector region 303, the second collector region 314 and the drain region 313 is formed on the semiconductor substrate 301, and an emitter/source electrode 312 electrically connected to the base region 304 and the emitter/source region 306 is formed on the semiconductor substrate 301. The emitter/source electrode 312 is electrically connected to the base region 304 through the contact region 305. Also, an interlayer film 308 is formed above the resurf region 302 with a field insulating film 307 sandwiched therebetween, and the collector/drain electrode 311 and the emitter/source electrode 312 are drawn onto the interlayer film 308.

In the high-breakdown voltage semiconductor switching device of this embodiment, when a positive bias voltage (hereinafter sometimes referred to as a collector voltage) is applied between the collector/drain electrode 311 and the emitter/source electrode 312 and a positive voltage is applied to the gate electrode 310, a current (hereinafter sometimes referred to as a collector current) starts to flow from the drain region 313 to the emitter/source electrode 312 through the resurf region 302, the base region 304 (a portion thereof corresponding to a channel region) and the emitter/source region 306 (which operation is a MOSFET operation). When the collector voltage is increased, the collector current is increased to some extent, and when potential of a portion of the resurf region 302 disposed around the first collector region 303 becomes lower than that of the first collector region 303 by, for example, approximately 0.6 V, holes start to be injected from the first collector region 303 into the resurf region 302, so as to change the MOSFET operation to an IGBT operation. At this point, when the collector voltage at which the MOSFET operation is changed to the IGBT operation is indicated by Vch, the voltage Vch can be controlled not in accordance with the collector region length X as in the high-breakdown voltage semiconductor switching device of Embodiment 1 shown in FIGS. 1 through 3 but in accordance with the length X1 of each section of the first collector region 303 shown in FIG. 13 in this embodiment. Furthermore, when the MOSFET operation is changed to the IGBT operation, a large collector current flows from the first collector region 303 to the emitter/source electrode 312 through the resurf region 302 (or the semiconductor substrate 301), the base region 304 and the contact region 305. Moreover, when a potential of a portion of the resurf region 302 disposed around the second collector region 314 becomes lower than that of the second collector region 314 by, for example, approximately 0.6 V owing to the collector current, holes start to be injected also from the second collector region 314 into the resurf region 302.

Specifically, in the high-breakdown voltage semiconductor switching device of this embodiment, current driving power (namely, on resistance Ron) equivalent to that of the high-breakdown voltage semiconductor switching device of Embodiment 1 shown in FIGS. 1 through 3 can be attained by adjusting the length X2 of each section of the second collector region 314 smaller than the length X1 of each section of the first collector region 303.

Furthermore, in the high-breakdown voltage semiconductor switching device of this embodiment, owing to the second collector region 314 including the sections each having the length X2 shorter than the length X1 of each section of the first collector region 303, the total area of the whole collector region can be suppressed, so as to shorten the fall time tf caused in turn off.

Figure 15:
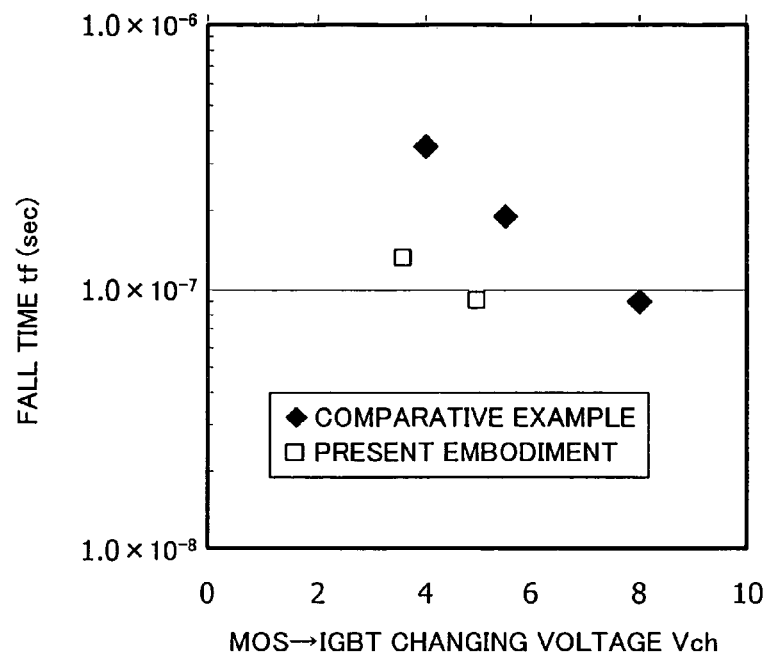
FIG. 15 is a diagram for showing the correlation between a collector voltage Vch for changing to an IGBT operation and a fall time tf in the high-breakdown voltage semiconductor switching device of Embodiment 5.

FIG. 15 is a diagram for showing the correlation between the collector voltage Vch and the fall time tf for evaluating actually fabricated prototypes of the high-breakdown voltage semiconductor switching device of this embodiment and the high-breakdown voltage semiconductor switching device of Embodiment 1 as a comparative example. As shown in FIG. 15, in the comparative example (i.e., the high-breakdown voltage semiconductor switching device of Embodiment 1 using the collector region including the sections having the collector region length X alone), the fall time tf measured under condition of the collector voltage Vch of, for example, 4 V is 350 nsec. In contrast, in the high-breakdown voltage semiconductor switching device of this embodiment, the fall time tf measured under condition of the collector voltage Vch of, for example, 3.6 V is 130 nsec. Furthermore, with respect to other data obtained under other conditions, the collector voltage Vch and the fall time tf can be both suppressed in this embodiment than in the comparative example as shown in FIG. 15, and thus, the trade-off relationship between the collector voltage Vch and the fall time tf is improved in this embodiment.

As described so far, according to this embodiment, assuming that the MOSFET operation is changed to the IGBT operation at the collector voltage Vch, the collector voltage Vch can be determined in accordance with the length X1 of each section of the first collector region 303 longer than the length X2 of each section of the second collector region 314. Also, owing to the second collector region 314 including the sections each having the length X2 shorter than the length X1 of each section of the first collector region 303, the total area of the whole collector region can be suppressed, so as to shorten the fall time tf caused in turn off. Accordingly, both the collector voltage Vch and the fall time tf can be suppressed, resulting in improving the trade-off relationship between the collector voltage Vch and the fall time tf.

Accordingly, in the case where the high-breakdown voltage semiconductor switching device of this embodiment is used in a switched mode power supply apparatus, the MOSFET operation can be performed in a standby mode or when load is light and the IGBT operation can be performed when the load is heavy, so that the loss can be reduced in the whole region ranging from light load to heavy load. In particular, as compared with a conventional switched mode power supply apparatus, loss caused when the load is heavy can be further reduced.

Now, the effect of this embodiment (the advantage of the collector/drain region structure of this embodiment) will be described in more detail.

Figure 16:
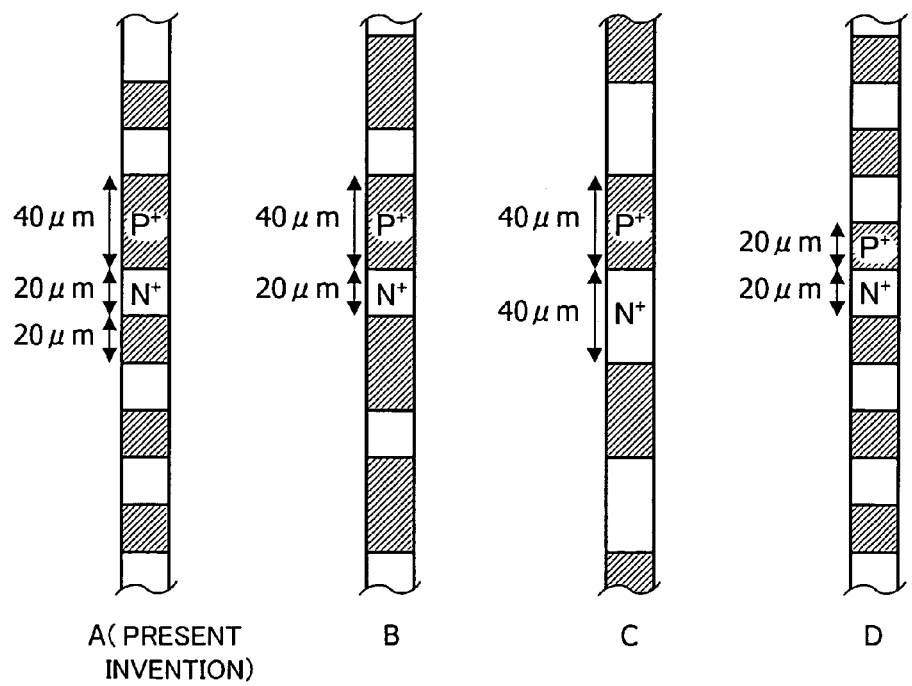
FIG. 16 is a schematic diagram for showing comparison between a collector/drain region structure of the high-breakdown voltage semiconductor switching device of Embodiment 5 and other collector/drain region structures.

FIG. 16 schematically shows comparison between a collector/drain region structure of this embodiment (hereinafter referred to as a structure A) in which a collector region ($P^+$ region) includes sections respectively having a relatively large length (of 40 μm) and a relatively small length (of 20 μm) and each section of a drain region ($N^+$ region) sandwiched between the sections of the collector region has a relatively small length (of 20 μm) and other collector/drain region structures. The other collector/drain region structures are a structure B in which a collector region ($P^+$ region) includes sections having a relatively large length (of 40 μm) alone and each section of a drain region ($N^+$ region) sandwiched between the sections of the collector region has a relatively small length (of 20 μm); a structure C in which a collector region ($P^+$ region) includes sections having a relatively large length (of 40 μm) alone and each section of a drain region ($N^+$ region) sandwiched between the sections of the collector region has a relatively large length (of 40 μm); and a structure D in which a collector region ($P^+$ region) includes sections having a relatively small length (of 20 μm) alone and each section of a drain region ($N^+$ region) sandwiched between the sections of the collector region has a relatively small length (of 20 μm).

FIG. 17 shows the characteristics of high-breakdown voltage semiconductor switching devices having the structures A through D, and specifically, shows an area ratio between the $P^+$ region and the $N^+$ region, a collector voltage Vch, a fall time tf and on resistance Ron (current driving power) measured under given conditions in each switching device.

The fall time tf is varied depending upon the measurement conditions, which are a drain current Id and on time (time from turn on to turn off of a gate voltage). When the drain current Id is increased, the fall time tf is increased (becomes worse). Also, when the on time is increased, the fall time tf is increased (becomes worse).

On the other hand, the on resistance Ron is also varied depending upon the measurement condition, which is the drain current Id (whereas the drain current Id of an active region before reaching a saturation region). In the IGBT operation, the on resistance Ron measured when the drain current Id is large is smaller.

As shown in FIG. 17, the structure A of this embodiment is obviously advantageous in the collector voltage Vch, the fall time tf and the on resistance Ron (the current driving power). The fall time tf and the on resistance Ron are both improved in the structure A of this embodiment than in the structure C probably for the following reasons:

(1) Since each section of the $N^+$ region is shorter in the structure A, the current density obtained by overlooking the structure is larger, and hence, the on resistance Ron can be smaller. Specifically, a large current flows from the $P^+$ region in the IGBT operation, and when a distance between the sections of the $P^+$ region is smaller as in the structure A, the current density per unit area obtained by overlooking the structure can be larger than when the distance between the sections of the $P^+$ region is larger. Therefore, the on resistance Ron can be made small to increase the current driving power.

(2) When the structure A is compared with the structure C, the area ratio between the $P^+$ region and the $N^+$ region is substantially the same but the number of sections of the $N^+$ region is larger in the structure A in which these sections are shorter than in the structure C. Therefore, the fall time tf is shorter in the structure A. Specifically, electrons are withdrawn from the $N^+$ region as the collector/drain voltage increases at the time of turn off, and since the number of sections of the $N^+$ region is larger in the structure A than in the structure C, the electrons are more efficiently withdrawn from the $N^+$ region, and hence, the fall time tf in the structure A is shorter.

In the structure A, also when the length of each shorter section of the $P^+$ region and the length of each section of the $N^+$ region are reduced to 10 μm with the length of each longer section of the $P^+$ region kept to 40 μm, the switching device is operable. However, when the length of each shorter section of the $P^+$ region is further reduced, the IGBT operation is turned on in the longer sections of the $P^+$ region but is not turned on in the shorter sections of the $P^+$ region. Therefore, there is a lower limit in the length of the shorter section of the $P^+$ region, whereas the lower limit is determined depending upon the concentration of the resurf region 302.

Furthermore, in the structure A, when the length of each section of the $N^+$ region is further reduced, the area ratio between the $P^+$ region and the $N^+$ region (the area of the $P^+$ region/the area of the $N^+$ region) is larger than 1, and the fall time tf is increased. On the other hand, when the length of each section of the $N^+$ region is further increased, the on resistance Ron is increased as is understood from the comparison between the characteristics of the structure B and the characteristics of the structure C shown in FIG. 17. Accordingly, the length of each section of the $N^+$ region and the length of each shorter section of the $P^+$ region are preferably equivalent to each other.

The measured characteristics of the high-breakdown voltage semiconductor switching device of Embodiment 1 shown in FIG. 7 and the measured characteristics of the structures B and C shown in FIG. 17 are obtained under different conditions, and therefore, for example, although the collector voltage Vch obtained when the collector region length X is approximately 40 μm is approximately 2 V in FIG. 7, the collector voltage Vch obtained when the length of each section of the collector region is approximately 40 μm is approximately 4 V in the structures B and C in FIG. 17. A principal difference between the device structure of Embodiment 1 and the device structure of the structures B and C is that the length of each section of the drain region ($N^+$ region) is 10 μm in Embodiment 1 while the length of each section of the $N^+$ region is 20 μm or 40 μm in the structure B or C.

Embodiment 6

A lateral high-breakdown voltage semiconductor switching device according to Embodiment 6 of the invention will now be described with reference to the accompanying drawings.

Figure 18:
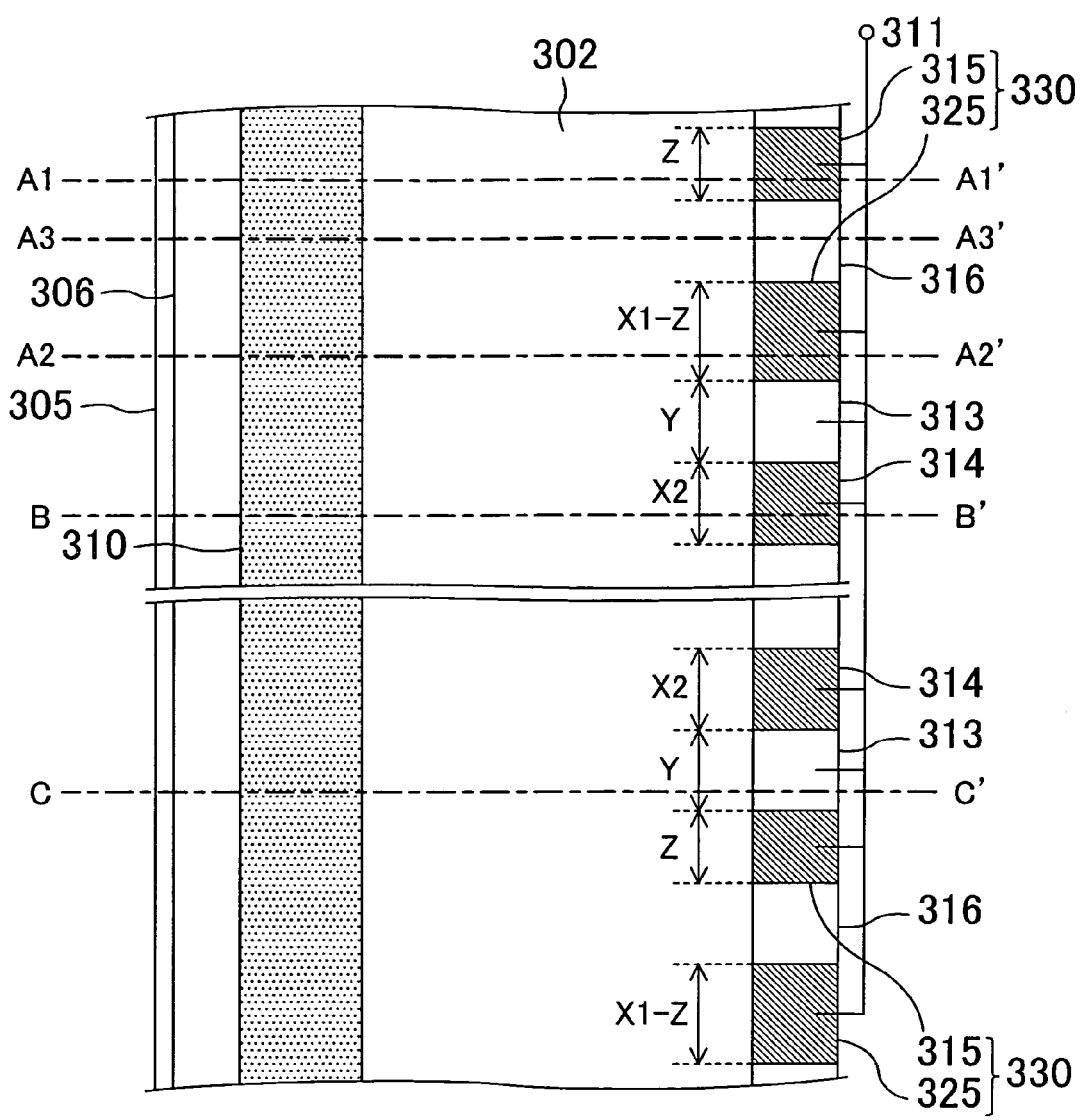
FIG. 18 is a plan view of a high-breakdown voltage semiconductor switching device according to Embodiment 6 of the invention.
Figure 19A:
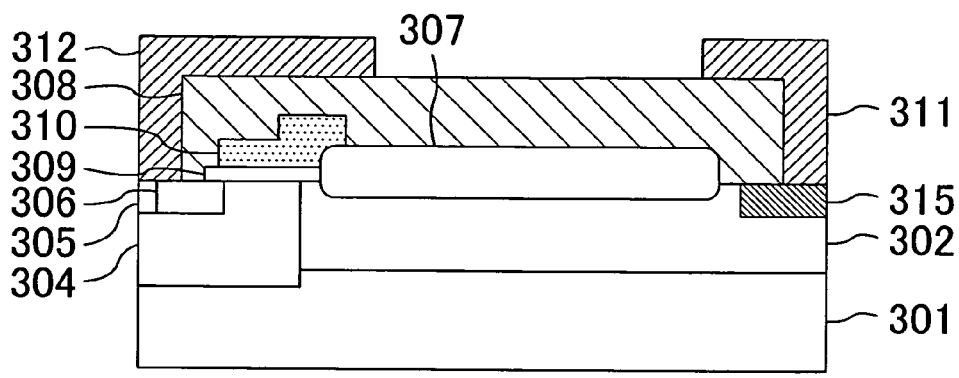
FIGS. 19A, 19B and 19C are cross-sectional views of the high-breakdown voltage semiconductor switching device of Embodiment 6.
Figure 19B:
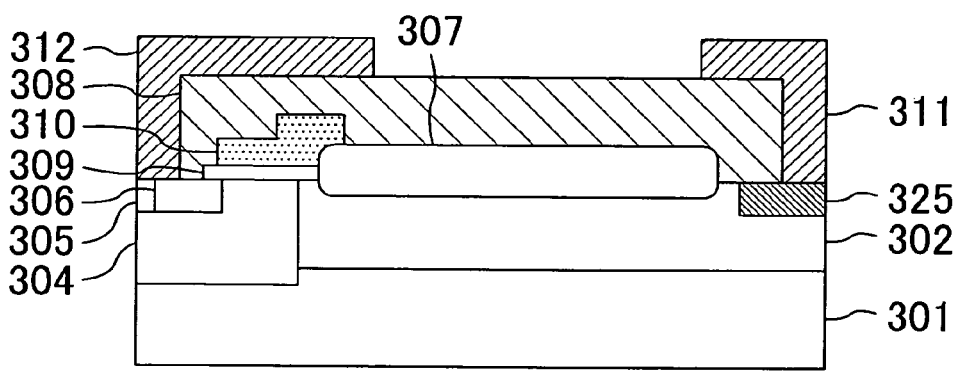
Figure 19C:
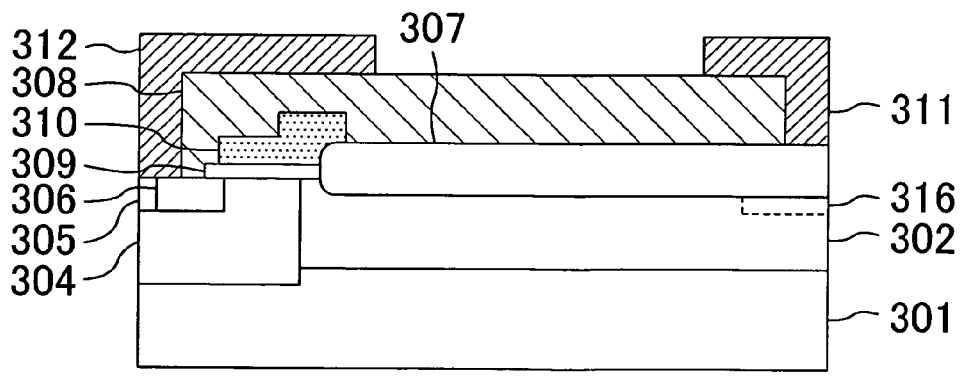

FIGS. 18 and 19A through 19C are diagrams for showing an exemplified architecture of the high-breakdown voltage semiconductor switching device of this embodiment, and specifically, FIG. 18 is a plan view thereof, FIG. 19A is a cross-sectional view thereof taken on line A1-A1' of FIG. 18, FIG. 19B is a cross-sectional view thereof taken on line A2-A2' of FIG. 18 and FIG. 19C is a cross-sectional view thereof taken on line A3-A3' of FIG. 18. It is noted that part of composing elements is omitted in FIG. 18. Also, a cross-sectional view taken on line B-B' of FIG. 18 is the same as that of Embodiment 5 shown in FIG. 14B and a cross-sectional view taken on line C-C' of FIG. 18 is the same as that of Embodiment 5 shown in FIG. 14C.

A difference of this embodiment from Embodiment 5 described above (see FIGS. 13 and 14A through 14C) is that the $p^+$ type first collector region 303 of Embodiment 5 is replaced with a $p^+$ type first collector region 330 as shown in FIGS. 18 and 19A through 19C. At this point, the first collector region 330 is composed of a third collector region 315 including a plurality of sections each having a given length Z along a vertical direction to a direction extending from the drain region 313 toward the emitter/source region 306 (hereinafter simply referred to as the vertical direction); and a fourth collector region 325 including a plurality of sections each having a given length X1-Z along the vertical direction. Furthermore, along the vertical direction, a portion of the resurf region 302 not connected to the collector/drain electrode 311 (hereinafter referred to as an N-type second resurf region 316) is sandwiched between and in contact with one section of the third collector region 315 and one section of the fourth collector region 325. The field insulating film 307 is formed on the second resurf region 316.

Excluding the aforementioned difference, the device structure of this embodiment is the same as that of Embodiment 5 shown in FIGS. 13 and 14A through 14C. Specifically, as shown in FIGS. 18 and 19A through 19C, each of the first collector region 330 including the second resurf region 316, the second collector region 314 and the drain region 313 includes a plurality of sections separated from one another. At this point, each section of the first collector region 330 is composed of one section of the third collector region 315 and one section of the fourth collector region 325 sandwiching the second resurf region 316. Also, the respective sections of the first collector region 330, the respective sections of the second collector region 314 and the respective sections of the drain region 313 are arranged along the vertical direction, so that each section of the drain region 313 can be sandwiched between and in contact with one section of the first collector region 330 and one section of the second collector region 314.

Also in this embodiment, the number of sections of the first collector region 330 and the number of sections of the second collector region 314 can be arbitrarily designed, and when the number of sections of the first collector region 330 is smaller than the number of sections of the second collector region 314, the total area of the whole collector region can be further suppressed, and hence, the fall time tf caused in turn off can be further reduced. Also, when the length of each section of the first collector region 330 (excluding the length of the second resurf region 316) along the vertical direction is indicated by X1 (=(the length Z of each section of the third collector region 315)+(the length X1-Z of each section of the fourth collector region 325)), the length X1 is, for example, approximately 40 μm. Furthermore, when the length of each section of the second collector region 314 along the vertical direction is indicated by X2, the length X2 is shorter than the length X1 and is, for example, approximately 20 μm. Moreover, when the length of each section of the drain region 313 along the vertical direction is indicated by Y, the length Y is, for example, approximately 20 μm.

The operation of the high-breakdown voltage semiconductor switching device of this embodiment is the same as that of Embodiment 5. When a positive vias voltage (hereinafter sometimes referred to as a collector voltage) is applied between the collector/drain electrode 311 and the emitter/source electrode 312 and a positive voltage is applied to the gate electrode 310, a current (hereinafter sometimes referred to as a collector current) starts to flow from the drain region 313 to the emitter/source electrode 312 through the resurf region 302, the base region 304 (a portion thereof corresponding to a channel region) and the emitter/source region 306

(which operation is a MOSFET operation). When the collector voltage is increased, the collector current is increased to some extent, and when potential of a portion of the resurf region 302 disposed around the third collector region 315 or the fourth collector region 325 becomes lower than that of the third collector region 315 or the fourth collector region 325 by, for example, approximately 0.6 V, holes start to be injected from the third collector region 315 or the fourth collector region 325 into the resurf region 302, so as to change the MOSFET operation to the IGBT operation. At this point, when the collector voltage at which the MOSFET operation is changed to the IGBT operation is indicated by Vch, the collector voltage Vch can be controlled not in accordance with the length X1 of the first collector region 303 as in the high-breakdown voltage semiconductor switching device of Embodiment 5 shown in FIG. 13 but in accordance with a sum of the length Z of each section of the third collector region 315 and the length X1-Z of each section of the fourth collector region 325 shown in FIG. 18, namely, in accordance with the length X1, in this embodiment. The reason is as follows: Since the second resurf region 316 sandwiched between one section of the third collector region 315 and one section of the fourth collector region 325 is not connected to the collector/drain electrode 311, no current flows from the second resurf region 316 even when the positive voltage is applied to the gate electrode 310. Therefore, there is substantially no difference, in the potential change of the portion of the resurf region 302 disposed around the first collector region 330 caused by the collector current flowing from the drain region 313, between the structure in which the first collector region 303 includes the sections with the collector region length X1 as in Embodiment 5 (see FIG. 13) and the structure in which the first collector region 330 is composed of the third collector region 315 including the plural sections each having the length Z and the fourth collector region 325 including the plural sections each having the length X1-Z as in this embodiment (see FIG. 18). Accordingly, the collector voltage Vch can be controlled in accordance with the sum of the length Z of each section of the third collector region 315 and the length X1-Z of each section of the fourth collector region 325, namely, the length X1, in this embodiment.

As described so far, according to this embodiment, the following effects can be attained in addition to the effects the same as those attained in Embodiment 5: Since the second resurf region 316 not connected to the collector/drain electrode 311 is disposed between one section of the third collector region 315 and one section of the fourth collector region 325, a wiring made of, for example, polysilicon can be formed above the second resurf region 316. In other words, the design freedom for the circuit pattern can be improved without degrading the device performance.

In this embodiment, the length Z of each section of the third collector region 315 is preferably equivalent to the length X1-Z of each section of the fourth collector region 325, namely, the length Z is preferably approximately X1/2, for making uniform a current distribution obtained by overlooking the collector/drain region structure. Specifically, when local current crowding is caused in the IGBT operation, the temperature of the crowded portion is largely increased to cause thermal runaway, and when the length Z of each section of the third collector region 315 is longer or shorter than X1/2, current pass obtained by overlooking the collector/drain region structure is not uniform. Therefore, the length Z is preferably approximately X1/2.

Accordingly, when the length X1 is set to approximately 40 µm as in this embodiment, the length Z is preferably approximately 20 µm. Thus, the device performance equivalent to that of the high-breakdown voltage semiconductor switching device of Embodiment 5 can be attained. Also, as described in Embodiment 5, the length Z of each section of the third collector region 315 and the length X1-Z of each section of the fourth collector region 325 can be reduced to approximately 10 µm.

Furthermore, in this embodiment, the length of the second resurf region 316 along the vertical direction needs to be set to at least approximately 10 µm in consideration of wiring above the second resurf region 316. Also, when the length of the second resurf region 316 is longer, namely, when the area of the N-type second resurf region 316 is larger, the on resistance Ron (the current driving power) is degraded, and therefore, the length of the second resurf region 316 is preferably approximately 20 µm or less.

Embodiment 7

A lateral high-breakdown voltage semiconductor switching device according to Embodiment 7 of the invention will now be described with reference to the accompanying drawings.

Figure 20:
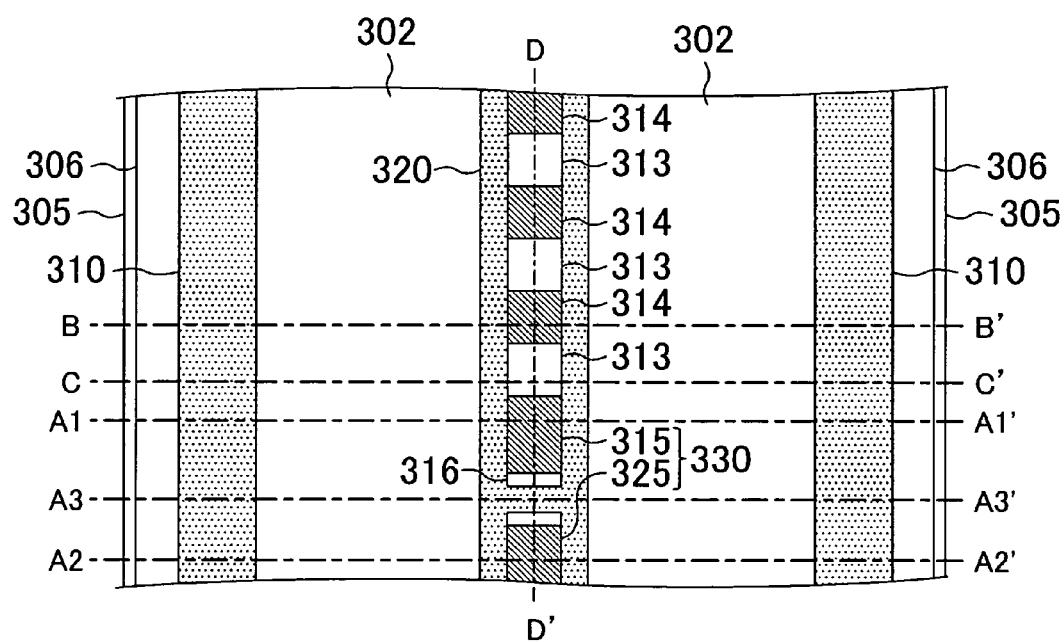
FIG. 20 is a plan view of a high-breakdown voltage semiconductor switching device according to Embodiment 7 of the invention.
Figure 21A:
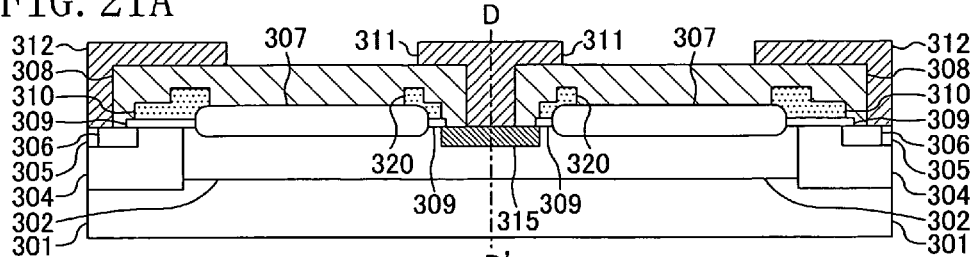
FIGS. 21A, 21B, 21C, 21D and 21E are cross-sectional views of the high-breakdown voltage semiconductor switching device of Embodiment 7.
Figure 21B:
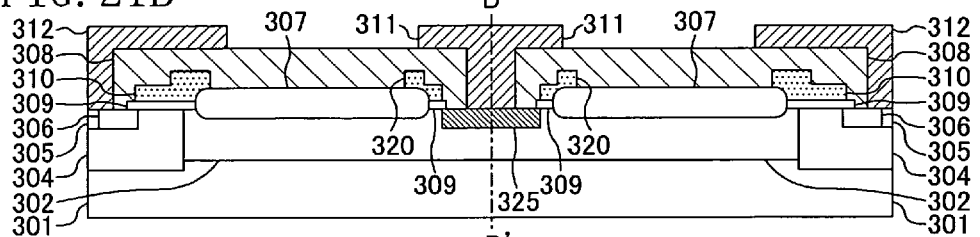
Figure 21C:
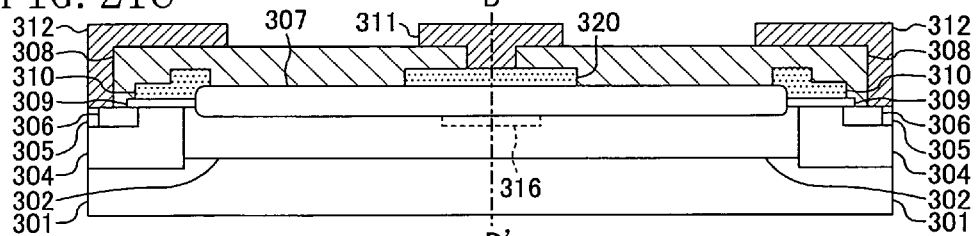
Figure 21D:
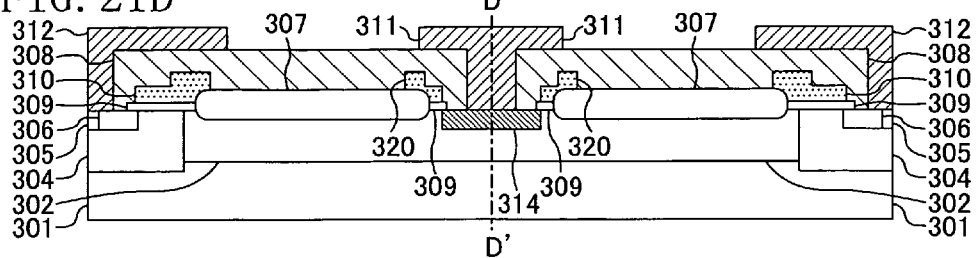
Figure 21E:
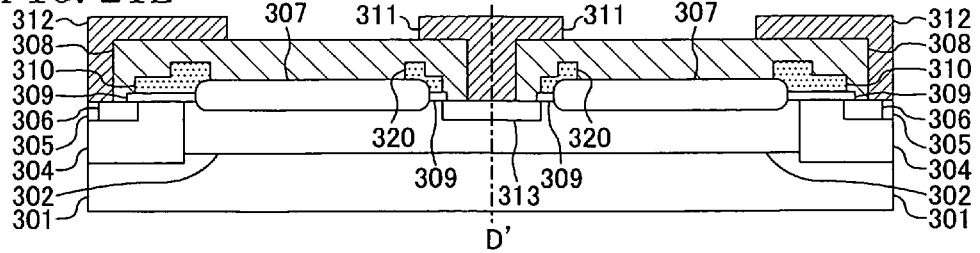

FIGS. 20 and 21A through 21E are diagrams for showing an exemplified architecture of the high-breakdown voltage semiconductor switching device of this embodiment, and specifically, FIG. 20 is a plan view thereof, FIG. 21A is a cross-sectional view thereof taken on line A1-A1' of FIG. 20, FIG. 21B is a cross-sectional view thereof taken on line A2-A2' of FIG. 20, FIG. 21C is a cross-sectional view thereof taken on line A3-A3' of FIG. 20, FIG. 21D is a cross-sectional view thereof taken on line B-B' of FIG. 20 and FIG. 21E is a cross-sectional view thereof taken on line C-C' of FIG. 20. It is noted that part of composing elements is omitted in FIG. 20. Also, for the convenience of description, two cell structures obtained by folding one cell structure shown in, for example, FIGS. 13 and 14A through 14C by line D-D' are shown in FIGS. 20 and 21A through 21E.

A difference of this embodiment from Embodiment 6 described above (see FIGS. 18 and 19A through 19C) is that a drain electric field reducing layer 320 made of, for example, polysilicon is formed between the interlayer film 308 and the resurf region 302 as shown in FIGS. 20 and 21A through 21E. At this point, at least a part of the drain electric field reducing layer 320 is disposed below a portion of the collector/drain electrode 311 drawn onto the interlayer film 308 with the interlayer film 308 sandwiched therebetween and is disposed, with the field insulating film 307 sandwiched therebetween, above the second resurf region 316 sandwiched between one section of the third collector region 315 and one section of the fourth collector region 325. Furthermore, as shown in FIG. 21C, the drain electric field reducing layer 320 is connected to the collector/drain electrode 311 above the second resurf region 316. It is noted that the gate insulating film 309 is disposed between the drain electric field reducing layer 320 and a portion of the resurf region 302 not covered with the field insulating film 307.

The device architecture of this embodiment is the same as that of Embodiment 6 shown in FIGS. 18 and 19A through 19C except for the aforementioned difference. Specifically, as shown in FIGS. 20 and 21A through 21E, each of the first collector region 330 including the second resurf region 316, the second collector region 314 and the drain region 313 includes a plurality of sections separated from one another. Each section of the first collector region 330 is composed of one section of the third collector region 315 and one section of the fourth collector region 325 sandwiching the second resurf region 316. Also, the respective sections of the first collector region 330, the respective sections of the second collector region 314 and the respective sections of the drain region 313 are arranged along a vertical direction to a direction extending from the drain region 313 toward the emitter/source region 306 (hereinafter simply referred to as the vertical direction), so that each section of the drain region 313 can be sandwiched between and in contact with one section of the first collector region 330 and one section of the second collector region 314.

The operation of the high-breakdown voltage semiconductor switching device of this embodiment is also the same as that of Embodiment 6.

As described so far, according to this embodiment, the following effects can be attained in addition to the same effects as those attained in Embodiment 6: Since the drain electric field reducing layer 320 is provided between the interlayer film 308 and the resurf region 302, the collector breakdown voltage can be further increased than in Embodiment 6. Also, since a part of the drain electric field reducing layer 320 is disposed above the second resurf region 316 so that it can be connected to the collector/drain electrode 311 in this position, the design freedom for the circuit pattern can be improved, and the area occupied by the drain electric field reducing layer and the contact area between the drain electric field reducing layer and the collector/drain electrode can be reduced. In contrast, in the case where a drain electric field reducing layer is provided above, for example, the drain region 313 or the second contact region 314 of Embodiment 5 shown in FIG. 13, a space for connecting the drain region 313 or the second collector region 314 to the collector/drain electrode 311 is too small and the connection is difficult.

Although the semiconductor switching device of this invention is provided on the P-type semiconductor substrate 301 including the N-type resurf region 302 in each of Embodiments 5 through 7, the semiconductor switching device of this invention may be provided on an N-type semiconductor substrate including a P-type resurf region instead.

What is claimed is:

1. A high-breakdown voltage semiconductor switching device comprising:
    a resurf region of a second conductivity type formed in a surface portion of a semiconductor substrate of a first conductivity type;
    a base region of the first conductivity type formed in said semiconductor substrate to be adjacent to said resurf region;
    an emitter/source region of the second conductivity type formed in said base region to be spaced from said resurf region;
    a gate insulating film formed over said base region to cover a portion of said emitter/source region and a portion of said resurf region;
    a gate electrode formed on said gate insulating film;
    a drain region of the second conductivity type formed in said resurf region to be spaced from said base region;
    a collector region of the first conductivity type formed in said resurf region to be spaced from said base region;
    a collector/drain electrode formed on said semiconductor substrate and electrically connected to said collector region and said drain region; and
    an emitter/source electrode formed on said semiconductor substrate and electrically connected to said base region and said emitter/source region,
    wherein each of said collector region and said drain region includes a plurality of sections separated from one another,
    said sections of said collector region and said sections of said drain region are alternately arranged to be in contact with one another along a vertical direction to a direction extending from said collector region toward said emitter/source region,
    said drain region is in direct contact with said resurf region, and
    said base region is in direct contact with said semiconductor substrate of the first conductivity type.

2. The high-breakdown voltage semiconductor switching device of claim 1, wherein each section of said collector region has a length of 48 µm or less along the vertical direction to the direction extending from said collector region toward said emitter/source region.

3. The high-breakdown voltage semiconductor switching device of claim 1,
    wherein a buffer layer of the second conductivity type having a higher impurity concentration than said resurf region is provided between said collector region and said resurf region.

4. The high-breakdown voltage semiconductor switching device of claim 1,
    wherein one or a plurality of semiconductor layers of the first conductivity type electrically connected to said base region are formed in said resurf region.

5. A switched mode power supply apparatus comprising:
    a semiconductor switching device to which an input DC voltage is applied;
    a voltage control circuit for controlling switching of said semiconductor switching device;
    a primary winding electrically connected to an output terminal of said semiconductor switching device;
    a secondary winding magnetically coupled to said primary winding; and
    a rectifying/smoothing circuit for rectifying and smoothing a voltage induced in said secondary winding for supplying an output DC voltage to a load,
    wherein said semiconductor switching device is the high-breakdown voltage semiconductor switching device of claim 1.

6. The switched mode power supply apparatus of claim 5, wherein
    the switched mode power supply apparatus further comprises a starting circuit for starting said voltage control circuit,
    in the high-breakdown voltage semiconductor switching device,
    arrangement of said sections of said collector region and said sections of said drain region is terminated by a terminating portion corresponding to a part of said drain region,
    a second drain region of the second conductivity type is formed in said resurf region to be spaced from said base region,
    a second drain electrode electrically connected to said second drain region is formed on said semiconductor substrate,
    said second drain region is electrically connected to said terminating portion of said drain region through said resurf region, and
    at least a part of a portion of said resurf region disposed between said second drain region and said terminating portion of said drain region has a smaller width than other portions, whereby pinching off a current path from said terminating portion of said drain region to said second drain region through an electric field effect when a voltage exceeding a given value is applied to said collector/drain electrode, and said second drain electrode of the high-breakdown voltage semiconductor switching device is electrically connected to said starting circuit.

7. The switched mode power supply apparatus of claim 5, further comprising a bias winding magnetically coupled to said primary winding and said secondary winding, wherein the switched mode power supply apparatus employs a ringing choke converter system in which a voltage induced in said bias winding is applied to a gate terminal of said semiconductor switching device through said voltage control circuit.

8. The high-breakdown voltage semiconductor switching device of claim 1, wherein said drain region does not protrude toward the emitter/source region with respect to the collector region in the direction extending from the collector region toward the emitter/source region.

9. The high-breakdown voltage semiconductor switching device of claim 1, wherein a length of said drain region is substantially the same as a length of said collector region in said direction extending from said collector region toward said emitter/source region.

10. A high-breakdown voltage semiconductor switching device comprising:

a resurf region of a second conductivity type formed in a surface portion of a semiconductor substrate of a first conductivity type;

a base region of the first conductivity type formed in said semiconductor substrate to be adjacent to said resurf region;

an emitter/source region of the second conductivity type formed in said base region to be spaced from said resurf region;

a gate insulating film formed over said base region to cover a portion of said emitter/source region and a portion of said resurf region;

a gate electrode formed on said gate insulating film;

a drain region of the second conductivity type formed in said resurf region to be spaced from said base region;

a collector region of the first conductivity type formed in said resurf region to be spaced from said base region;

a collector/drain electrode formed on said semiconductor substrate and electrically connected to said collector region and said drain region; and an emitter/source electrode formed on said semiconductor substrate and electrically connected to said base region and said emitter/source region, wherein each of said collector region and said drain region includes a plurality of sections separated from one another, said sections of said collector region and said sections of said drain region are alternately arranged to be in contact with one another along a vertical direction to a direction extending from said collector region toward said emitter/source region, wherein arrangement of said sections of said collector region and said sections of said drain region is terminated by a terminating portion corresponding to a part of said drain region, a second drain region of the second conductivity type is formed in said resurf region to be spaced from said base region, a second drain electrode electrically connected to said second drain region is formed on said semiconductor substrate, said second drain region is electrically connected to said terminating portion of said drain region through said resurf region, and at least a part of a portion of said resurf region disposed between said second drain region and said terminating portion of said drain region has a smaller width than other portions, whereby pinching off a current path from said terminating portion of said drain region to said second drain region through an electric field effect when a voltage exceeding a given value is applied to said collector/drain electrode.

11. A high-breakdown voltage semiconductor switching device comprising:

a resurf region of a second conductivity type formed in a surface portion of a semiconductor substrate of a first conductivity type;

a base region of the first conductivity type formed in said semiconductor substrate to be adjacent to said resurf region;

an emitter/source region of the second conductivity type formed in said base region to be spaced from said resurf region;

a gate insulating film formed over said base region to cover a portion of said emitter/source region and a portion of said resurf region;

a gate electrode formed on said gate insulating film;

a drain region of the second conductivity type formed in said resurf region to be spaced from said base region;

a first collector region of the first conductivity type formed in said resurf region to be spaced from said base region;

a second collector region of the first conductivity type formed in said resurf region to be spaced from said base region;

a collector/drain electrode formed on said semiconductor substrate and electrically connected to said first collector region, said second collector region and said drain, region; and an emitter/source electrode formed on said semiconductor substrate and electrically connected to said base region and said emitter/source region, wherein each of said first collector region, said second collector region and said drain region includes a plurality of sections separated from one another, each section of said first collector region has a given length X1 along a vertical direction to a direction extending from said drain region toward said emitter/source region, each section of said second collector region has a given length X2 shorter than said length X1 along the vertical direction, and said sections of said first collector region, said sections of said second collector region and said sections of said drain region are arranged along the vertical direction in such a manner that each section of said drain region is sandwiched between and in contact with a section of said first collector region and a section of said second collector region.

12. The high-breakdown voltage semiconductor switching device of claim 11, wherein the number of sections of said first collector region is smaller than the number of sections of said second collector region.

13. The high-breakdown voltage semiconductor switching device of claim 11, wherein said first collector region is composed of a third collector region including a plurality of sections each having a given length Z along the vertical direction and a fourth collector region including a plurality of sections each having a given length X1-Z along the vertical direction, and a portion of said resurf region not connected to said collector/drain electrode is sandwiched between and in contact with a section of said third collector region and a section of said fourth collector region along the vertical direction.

14. The high-breakdown voltage semiconductor switching device of claim 13,
wherein said collector/drain electrode is drawn onto an interlayer film formed above said resurf region,
the high-breakdown voltage semiconductor switching device further comprises a drain electric field reducing layer formed between said interlayer film and said resurf region and electrically connected to said collector/drain electrode, and
at least a part of said drain electric field reducing layer is disposed below a portion of said collector/drain electrode drawn onto said interlayer film and disposed above said portion of said resurf region sandwiched between a section of said third collector region and a section of said fourth collector region.

* * * * *